United States Patent
Furutani

[11] Patent Number: 5,926,051
[45] Date of Patent: *Jul. 20, 1999

[54] SELF REFRESH TIMER

[75] Inventor: Kiyohiro Furutani, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/708,110

[22] Filed: Sep. 6, 1996

Related U.S. Application Data

[60] Continuation of application No. 08/444,355, May 18, 1995, abandoned, which is a division of application No. 08/305,927, Sep. 19, 1994, abandoned.

[30] Foreign Application Priority Data

Oct. 7, 1993 [JP] Japan ................................ 5-251607

[51] Int. Cl.⁶ ....................................... H03K 3/02
[52] U.S. Cl. ................... 327/198; 327/200; 327/284; 327/332; 327/398; 365/222
[58] Field of Search ..................... 327/538, 182, 327/183, 101, 302, 398, 138, 188, 200, 203, 261, 284, 331, 332, 198; 331/111, 143; 365/222

[56] References Cited

U.S. PATENT DOCUMENTS

| | | | |
|---|---|---|---|
| 4,453,237 | 6/1984 | Reese et al. | 365/222 |
| 4,535,305 | 8/1985 | Matsuo et al. | 331/111 |
| 4,551,691 | 11/1985 | Ogawa | 331/111 |
| 4,607,238 | 8/1986 | Kohsiek | 331/111 |
| 5,311,476 | 5/1994 | Kajimoto et al. | 365/222 |
| 5,402,011 | 3/1995 | Aoki | 327/530 |

FOREIGN PATENT DOCUMENTS 42 37 589  3/1993  Germany .

OTHER PUBLICATIONS

Sedra et al., Microelectronic Circuits, 1991, pp. 963–964.

"A Fast 256K × 4 CMOS DRAM With A Distributed Sense and Unique Restore Circuit", Hiroshi Miyamoto, et al, *IEEE Journal of Solid–State Circuits*, vol. Sc–22, No. 5, Oct. 1987, pp. 861–867.

"A 4–Mb PSEUDO SRAM Operating at 2.6±1 V With 3–$\mu$A Data Retention Current", Katsuyuki Sato, et al, *IEEE Journal of Solid–State Circuits*, vol. 26, No. 11, Nov. 1991, pp. 1556–1562.

Sato et al, "A 4–MB PSEUDO SRAM Operating at 2.6+/−1 V With 3–$\mu$ADATA Retention Current", IEEE Journal of Solid–State Circuits, vol. 26, No. 11, Nov. 1991.

Miyamoto et al, "A Fast 256K×4 CMOS DRAM With A Distributed Sense and Unique Restore Circuit", IEEE Journal of Solid–State Circuits, vol. SC–22, No. 5, Oct. 1987.

*Primary Examiner*—Tim Callahan
*Assistant Examiner*—Jung Ho Kim
*Attorney, Agent, or Firm*—McDermott, Will & Emery

[57] ABSTRACT

By setting the substrate potential of a transistor of a driver means lower than the substrate potential of a transistor of a bias means in an intermediate potential generation circuit which supplies a cell plate potential of a memory cell and a precharge potential of a bit line, a flow of a through current in a transistor of the driver means is prevented. Therefore, reduction of a power consumption of the device during standby can be realized.

9 Claims, 32 Drawing Sheets

FIG. 10(a) /RAS 
FIG. 10(b) /φs 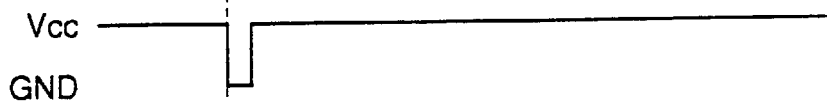
FIG. 10(c) N10 

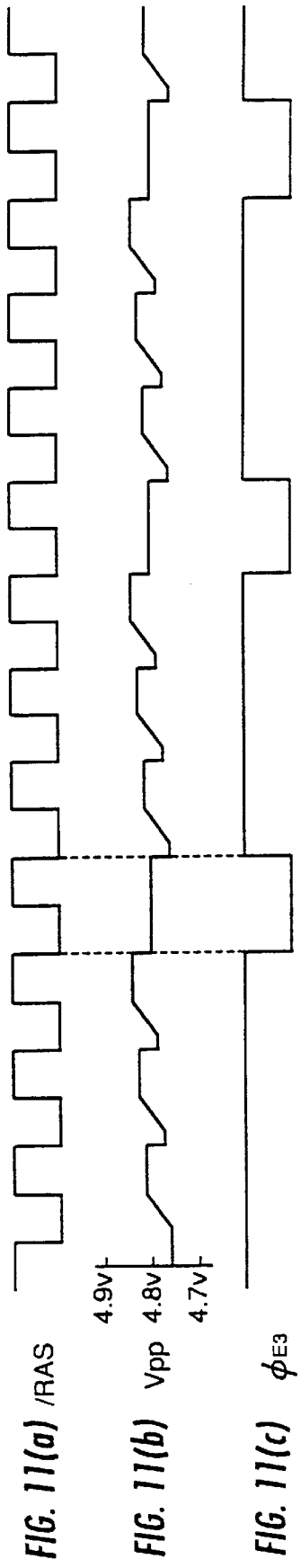

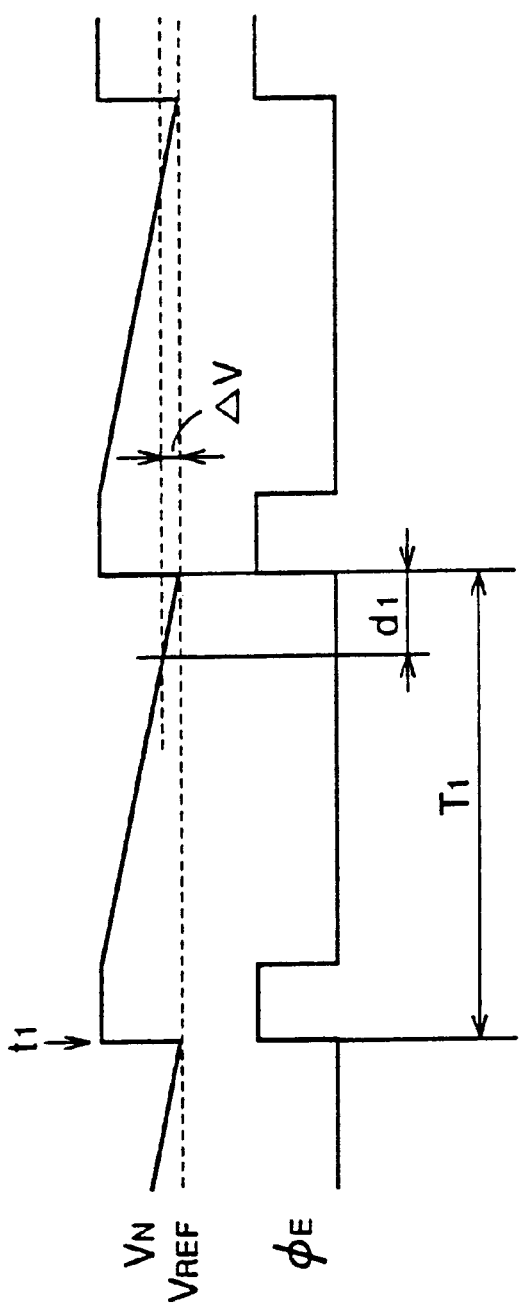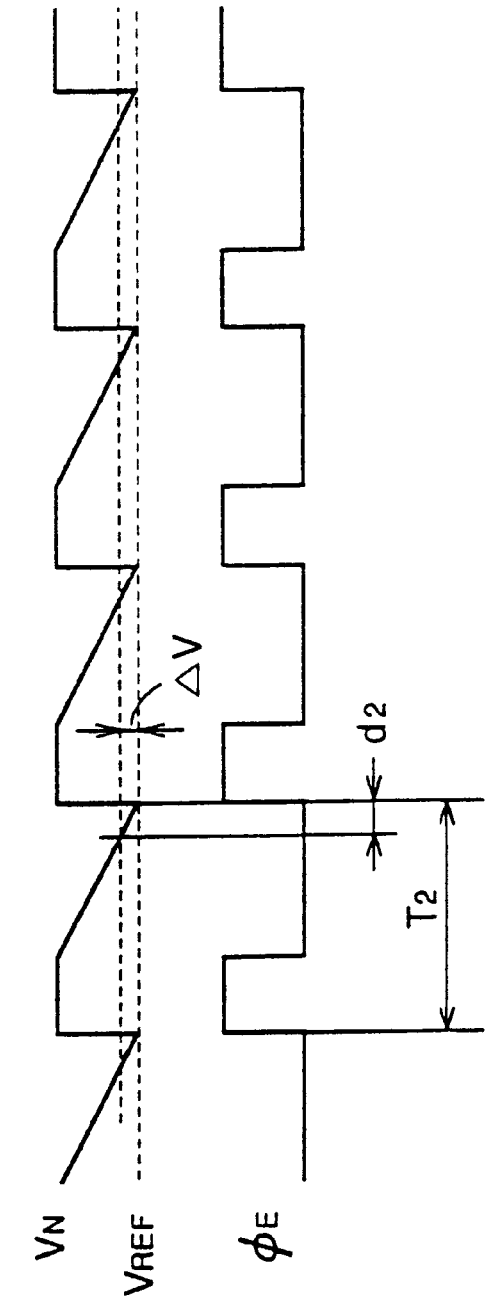
FIG. 28A(a) PRIOR ART
FIG. 28A(b) PRIOR ART
FIG. 28B(a) PRIOR ART
FIG. 28B(b) PRIOR ART

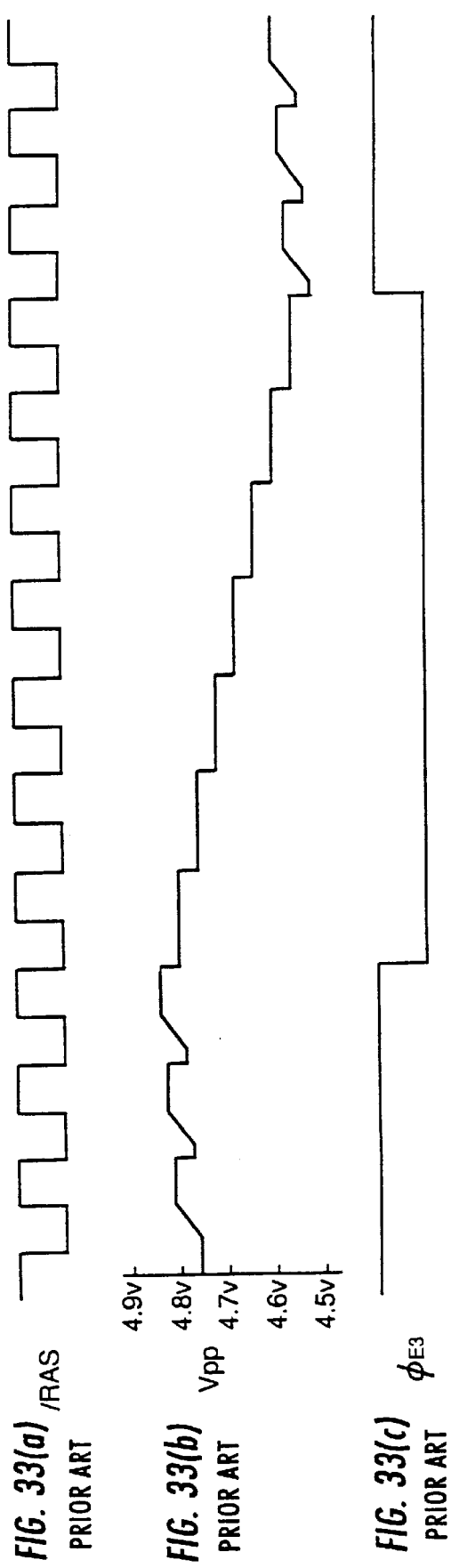
FIG. 33(a) /RAS PRIOR ART
FIG. 33(b) Vpp PRIOR ART
FIG. 33(c) φE3 PRIOR ART

5,926,051

SELF REFRESH TIMER

This application is a continuation of application Ser. No. 08/444,355 filed May 18, 1995 now abandoned, which is a division of application Ser. No. 08/305,927 filed Sep. 19, 1994 now abandoned.

BACKGROUND OF THE INVENTION

1. Field of the Invention

The present invention relates to a semiconductor device, and more particularly, to a semiconductor device that can have power consumption reduced.

2. Description of the Background Art

Semiconductor devices incorporated in various equipments have the scale of integration increased in order to reduce the size of the device and to integrate much more powerful logic. Increase in the integration density will result in a great number of elements operating inside to raise the heat. Therefore, reducing power consumption is an important factor. For example, in a DRAM (Dynamic Random Access Memory), there is a great demand for reducing the power consumption as a result of increase in the number of elements according to increase in the storage capacity.

A DRAM as a conventional semiconductor memory device will be described in detail hereinafter. A DRAM includes an intermediate potential generation circuit for generating precharge potential for a bit line, a timer circuit for carrying out a self refresh operation, and an internal high voltage circuit for generating high potential to be provided to a word line drive circuit.

An intermediate potential generation circuit will first be described. An example of an intermediate potential generation circuit is disclosed in IEEE Journal of Solid-State Circuit, Vol. SC-22, No. 5, October 1987, pp. 861–867. FIG. 25 is a circuit diagram showing a structure of a conventional intermediate potential generation circuit thereof.

Referring to FIG. 25, an intermediate potential generation circuit includes transistors Q11–Q103 which are n type MOSFETs, transistors Q104–Q106 which are p type MOSFETs, and resistors R101–R104.

FIG. 26 schematically shows a structure of the intermediate potential generation circuit of FIG. 25 on a p type substrate. Referring to FIG. 26, the intermediate potential generation circuit includes a p type substrate 111, an n type well 112, transistors Q101–Q106, and resistors R101–R104. In FIG. 26, components corresponding to those of FIG. 25 have the same reference characters denoted.

An operation of the intermediate potential generation circuit will be described hereinafter with reference to FIGS. 25 and 26.

The resistance of resistors R101 and R102 equal each other. Also, the resistance of resistors R103 and R104 equal each other. The resistance of resistors R101–R104 is several mΩ, which is high resistance. Therefore, the current flowing in transistors Q101, Q102, Q104 and Q105 is reduced, and these transistors conduct lightly. Therefore, the gate-source potential of transistor Q101, Q102, Q104 and Q105 is equal to the threshold voltage of each transistor.

According to the above-described structure, the potential of nodes N1 and N3 is approximately $V_{CC}/2$ ($V_{CC}$ is the power supply voltage). Therefore, the potential of node N2 becomes $V_{CC}+V_{TH101}$ ($V_{TH101}$ is the threshold voltage of transistor Q101), and the potential of node N4 is approximately $V_{CC}/2-|V_{TH105}|$ ($V_{TH105}$ is the threshold voltage of transistor Q105). When the potential of an output signal $V_{sg}$ is lower than $V_{CC}+V_{TH101}-V_{TH103}$ ($V_{TH103}$ is the threshold voltage of transistor Q103), transistor Q013 conducts, whereby the potential of output signal $V_{sg}$ rises. When the potential of output signal $V_{sg}$ is higher than $V_{CC}-|V_{TH105}|+V_{TH106}|$ ($V_{TH106}$ is the threshold voltage of transistor Q106), transistor Q106 conducts, whereby the potential of output signal $V_{sg}$ falls. By the above-described operation, the potential of output signal $V_{sg}$ becomes approximately $V_{CC}/2$.

A timer circuit for a self refresh operation will be described hereinafter. A refresh operation must be carried out periodically since a DRAM is a volatile memory. Lengthening the period of a refresh operation will reduce power consumption thereof, to allow reduction of power consumption in the device. In a conventional timer circuit, a refresh operation is carried out when the potential held in a memory cell becomes lower than a predetermined level. An example of such a timer circuit is disclosed in IEEE Journal of Solid-State Circuits, Vol. 26, No. 11, November 1991, pp. 1556–1562. FIG. 27 shows a structure of this conventional timer circuit.

Referring to FIG. 27, a timer circuit includes a differential amplifier 121, an S-R flipflop 122, a delay circuit 123, a transistor Q111 which is an n type MOSFET, a capacitor 124 of a memory cell, and an n type diffusion layer 125.

FIGS. 28A(a), 28A(b), 28B(a) and 28B(b) are timing charts showing the operation of the timer circuit of FIG. 27.

An operation of the timer circuit will be described hereinafter with reference to FIGS. 27, 28A(a), 28A(b), 28B(a) and 28B(b). When the potential $V_N$ in capacitor 124 becomes lower than a reference potential $V_{REF}$ at time $t_1$, S-R flipflop 122 is set to render the level of an output signal $\phi_E$ to a H level (logical high). Output signal $\phi_E$ of S-R flipflop 122 is delayed for a predetermined time, and then applied to a reset terminal R of S-R flipflop 122. As a result, a reset signal R attains a H level. This causes S-R flipflop 122 to be reset, whereby output signal $\phi_E$ attains a L level (logical low). A refresh operation is carried while output signal $\phi_E$ attains a H level, whereby transistor Q111 attains a conductive state, and the potential of capacitor 124 of a memory cell is maintained at $V_{CC}$. Then, when output signal $\phi_E$ attains a L level, transistor Q111 is rendered non-conductive, whereby the holding voltage $V_N$ of capacitor 124 is gradually reduced by leakage current. When holding voltage $V_N$ of capacitor 124 becomes lower than reference voltage $V_{REF}$, an operation similar to that of the above-described operation is repeated. Thus, a refresh operation is carried out at a predetermined period.

An internal high voltage circuit will be described. FIG. 29 is a block diagram showing a structure of a conventional internal high voltage circuit. Referring to FIG. 29, an internal high voltage circuit includes a first detector 132, a second detector 132, a third detector 133, a first oscillator 134, a second oscillator 135, a small pump 136, a large pump 137, a RAS pump 138, and an AND gate G101 and an inverter G102.

When high voltage $V_{PP}$ supplied to a word line driver 139 becomes lower than a predetermined potential, first detector 131 provides an output signal $\phi_{E1}$ of a H level to first oscillator 134. First oscillator 134 oscillates while output signal $\phi_{E1}$ attains a H level, and provides an oscillation signal to small pump 136. Small pump 136 responds to this oscillation signal to provide high voltage $V_{PP}$ to word line driver 139 at a standby state.

When the high voltage supplied to word line driver 139 becomes lower than a predetermined potential, second detector 132 provides an output signal $\phi_{E2}$ of H level to second oscillator 135. Second oscillator 135 oscillates when output signal $\phi_{E2}$ attains a H level, and provides an oscillation signal to large pump 137. Large pump 137 responds to this oscillation signal to rapidly increase high voltage $V_{PP}$ supplied to word line driver 139.

When high voltage $V_{PP}$ supplied to word line driver 139 becomes lower than a predetermined potential, third detector 133 provides an output signal $\phi_{E3}$ of a H level to AND gate G101. AND gate G101 takes the logical product of output signal $\phi_{E3}$ and an inverted signal of a row address strobe signal/RAS ("/" implies a low-active signal) to provide an output signal to RAS pump 138. AND gate G101 provides an output signal when row address strobe signal/RAS attains a L level, whereby the semiconductor device operates to raise the word line to high voltage $V_{PP}$.

The first detector shown in FIG. 29 will be described with reference to FIG. 30 showing a circuit diagram thereof.

Referring to FIG. 30, a first detector includes transistors Q121–Q124 which are p type MOSFETs, and transistors Q125 and Q126 which are n type MOSFETs.

High voltage $V_{PP}$ provided to the first detector is reduced by a threshold voltage $V_{TH}$ of each transistor, i.e., by 3 $V_{TH}$, by transistors Q121–Q123. Therefore, an output signal $\phi_{E1}$ of a H level is output when high voltage $V_{PP}$ becomes lower than $V_{CC}+3\ V_{TH}$.

The second detector of FIG. 29 will be described hereinafter with reference to FIG. 31 showing a circuit diagram thereof.

Referring to FIG. 31, a second detector includes transistors Q131–Q133 which are p type MOSFETs, and transistors Q134 and Q135 which are n type MOSFETs.

High voltage $V_{PP}$ provided to the second detector is reduced by a threshold voltage $V_{TH}$ of each transistor, i.e. 2 $V_{TH}$, by transistors Q131 and Q132. Therefore, the second detector provides an output signal $\phi_{E2}$ of a H level when high voltage $V_{PP}$ becomes lower than $V_{CC}+2\ V_{TH}$. The third detector of FIG. 29 has a structure similar to that of the second detector of FIG. 31, and also operates in a similar manner thereof.

The first oscillator of FIG. 29 will be described hereinafter with reference to FIG. 32 showing a circuit diagram thereof.

Referring to FIG. 32, a first oscillator includes transistors Q141–Q148 which are p type MOSFETs, and transistors Q149–Q156 which are n type MOSFETS. C101–C103 shown in FIG. 20 are the parasitic capacitance of each portion.

Because transistor Q141 has a long channel length, current flowing in transistor Q149 is limited to a current value of $I_1$. Transistor Q149 and transistors Q150, Q152, Q154 and Q156 form a current mirror, so that current flowing through transistors Q143, Q145, Q147, Q152, Q154 and Q156 is limited to the value of $I_1$. Therefore, the delay time of each inverter formed by each of these transistors becomes $3C/I_1$ where each capacitance of parasitic capacitances C101–C103 is C.

When $V_{CC}/2+V_{TH101}-V_{TH103}>V_{sg}=V_{CC}/2$, and $V_{CC}/2-|V_{TH105}|+|V_{TH106}|<V_{sg}=V_{CC}/2$, i.e. $V_{TH101}>V_{TH103}$, and $|V_{TH105}|>|V_{TH106}|$ in the intermediate potential generation circuit of FIG. 17, a through current flows in transistors Q103 and Q106 at the time of standby since transistors Q103 and Q106 both conduct when the potential of output signal $V_{sg}$ is stable at $V_{CC}/2$. There was a problem that the power consumption of the device was increased due to this through current.

In the timer circuit of FIG. 27, the period of a refresh operation is $T_1$ at low temperature as shown in FIGS. 28A(a) and 28A(b), and is $T_2$ at high temperature as shown in FIGS. 28B(a) and 28B(b) because leakage current of capacitor 124 increases at high temperature.

The timer circuit shown in FIG. 27 had problems set forth in the following. A phenomenon called soft error is seen in a DRAM. More specifically, α particles emitted from the package or the like cause the generated electrons to be captured in an n type diffusion layer 125 of a memory cell, whereby information in the memory cell is destroyed. Therefore, soft error easily occurs when the holding voltage $V_N$ becomes not higher than the lowest holding voltage $V_{REF}$ required for proper operation of a readout circuit of a memory cell by a predetermined value of $\Delta V$. As a result, when the level of holding voltage $V_{REF}$ is equal at both the high and low temperature, the time period having a high probability of generating soft error is $d_1$ and $d_2$ at a low temperature and a high temperature, respectively, as shown in FIGS. 28A(a), 28A(b), 28B(a) and 28B(b). Therefore, there was a problem that the possibility of soft error occurrence is increased at low temperature.

In the first and second detectors shown in FIGS. 30 and 31, a through current is conducted to increase power consumption since all transistors Q124, Q126, Q133 and Q135 become conductive when the level of output signals $\phi_{E1}$ and $\phi_{E2}$ change.

In the third detector shown in FIG. 31, the time required for pulling the potential of the node between transistorS Q132 and Q134 from a H level to a L level is several μs. An operation of a DRAM occurs at the minimum of every 90 ns, for example. Therefore, a word line is driven several ten times during the transition of the third director from an off state to an on state, resulting in reduction of the level of high voltage $V_{PP}$ of word line driver 139. FIGS. 33(a) to 33(c) are diagrams for describing the change in the level of high voltage $V_{PP}$ with respect to output signal $\phi_{E3}$ of the third director. It is appreciated from FIGS. 33(a) to 33(c) that the level of high voltage $V_{PP}$ is gradually reduced according to each transition of row address strobe signal/RAS when output signal $\phi_{E3}$ attains a L level. Therefore, a conventional third detector is set so that sufficient current is conducted to transistor Q134 in order to rapidly pull down the potential of the node between transistors Q132 and Q134 rapidly to a L level from a H level. Thus, there was a problem that power consumption is increased during standby.

In the first oscillator of FIG. 32, the delay time of $3C/I_1$ is reduced due to increase of current $I_1$ flowing in transistor Q141 in response to increase of power supply potential $V_{CC}$. This causes the oscillation frequency of the first oscillator to be increased to shorten the operation cycle. Thus, there was a problem that power consumption of the device is increased.

SUMMARY OF THE INVENTION

An object of the present invention is to provide a semiconductor device including a self refresh timer circuit that can have a refresh period set taking into consideration soft error.

A semiconductor device according to the present invention includes a self refresh timer circuit. The self refresh timer circuit includes a capacitor for storing charge, a charging circuit for charging the capacitor for a predetermined time when the output of the capacitor becomes lower than a first potential, a first current source connected to the capacitor, and a second current source connected to the capacitor. The first current source has stronger dependence on the temperature than the second current source.

According to the above-described structure, the time period of the output of the capacitor attaining a level lower than the first potential can be set to a desired value taking into consideration the change in temperature, so that a refresh period taking into consideration soft error can be realized. Therefore, reduction in the power consumption of the device can be realized without increasing the soft error rate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10($a$) to 10($c$) are timing charts for describing the operation of the third detector of FIG. 9.

FIGS. 11($a$) to 11($c$) are diagrams for describing change in the level of the high voltage with respect to the output signal of the third detector of FIG. 9.

FIGS. 28A($a$), 28A($b$), 28B($a$) and 28B($b$) are timing charts for describing the operation of the self refresh timer circuit of FIG. 27.

FIGS. 33($a$) to 33($c$) are diagrams for describing the change of the high voltage level of the internal high voltage circuit of FIG. 29.

DESCRIPTION OF THE PREFERRED EMBODIMENTS

A semiconductor device according to a first embodiment of the present invention will be described hereinafter with reference to the drawings.

Figure 1:
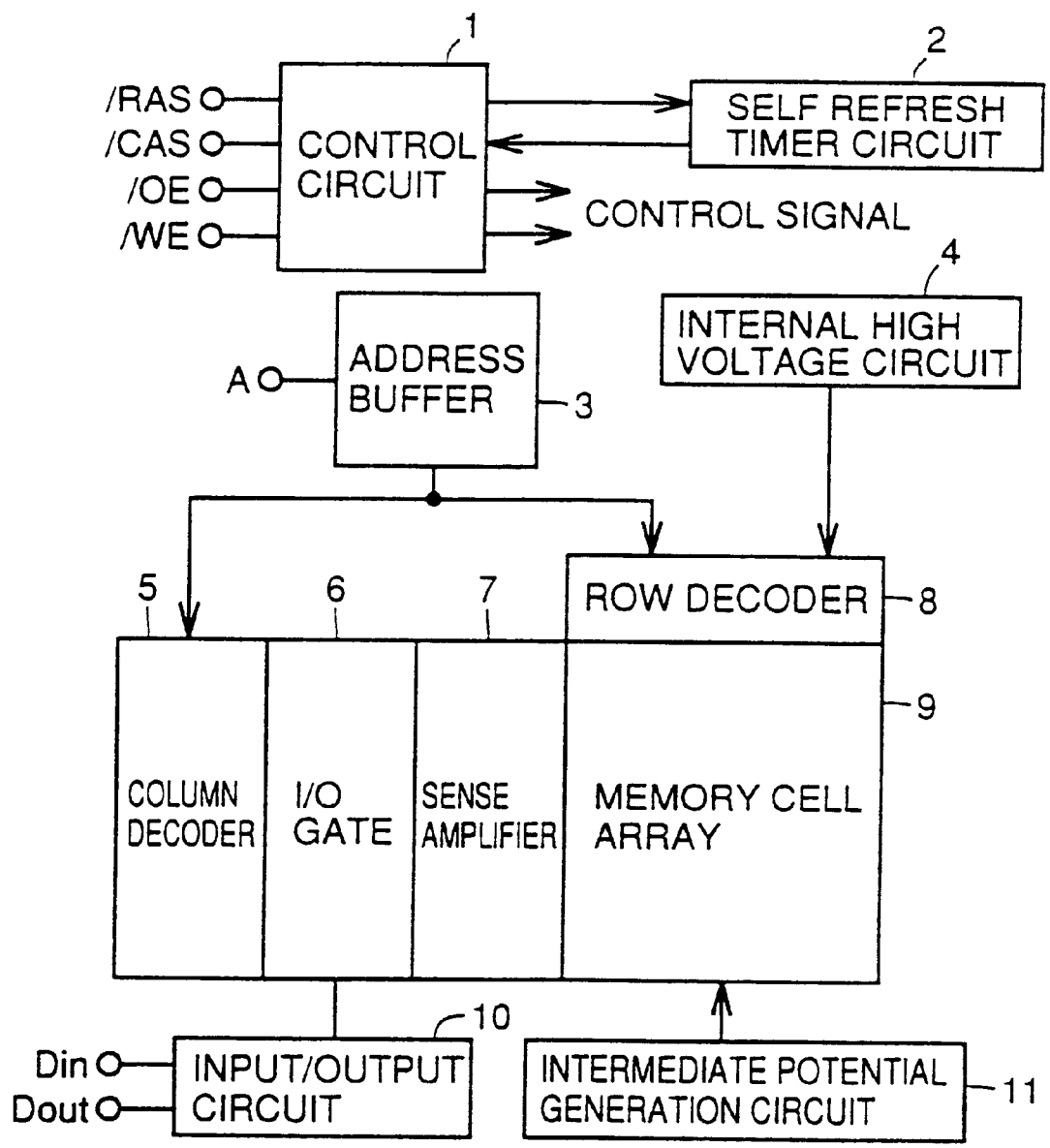
FIG. 1 is a block diagram showing a structure of a semiconductor device according to a first embodiment of the present invention.

FIG. 1 is a block diagram showing a structure of a DRAM (Dynamic Random Access Memory) according to a first embodiment of the present invention.

Referring to FIG. 1, a DRAM includes a control circuit 1, a self refresh timer circuit 2, an address buffer 3, an internal high voltage circuit 4, a column decoder 5, an I/O gate 6, a sense amplifier 7, a row decoder 8, a memory cell array 9, an input/output circuit 10, and an intermediate potential generation circuit 11.

A row address strobe signal/RAS, a column address strobe signal/CAS, an output enable signal/OE, and a write enable signal/WE are applied to control circuit 1 to provide control signals for determining the timing of each operation of the DRAM. Self refresh timer circuit 2 receives an output signal of control circuit 1 to provide a control signal for determining the timing of a self refresh operation to control circuit 1. Address buffer 3 receives an address signal to provide an internal column address signal and an internal row address signal to column decoder 5 and row decoder 8, respectively. Internal high voltage circuit 4 generates a high voltage $V_{PP}$ higher than power supply voltage $V_{CC}$, which is provided to row decoder 8. Row decoder 8 responds to an internal row address signal to select and drive a predetermined word line in memory cell array 9. Information in a memory cell connected to the selected word line is transmitted to sense amplifier 7 via a bit line. Column decoder 5 responds to an internal column address signal to select a predetermined bit line. The selected bit line is connected to sense amplifier 7. The connected sense amplifier 7 is connected to input/output circuit 10 via I/O gate 6. Internal potential generation circuit 11 applies a cell plate potential to a memory cell in memory cell array 9, and a precharge potential of a bit line.

According to the above operation, writing or reading information with respect to a predetermined memory cell in memory cell array 9 is carried out according to a control signal of control circuit 1.

Figure 2:
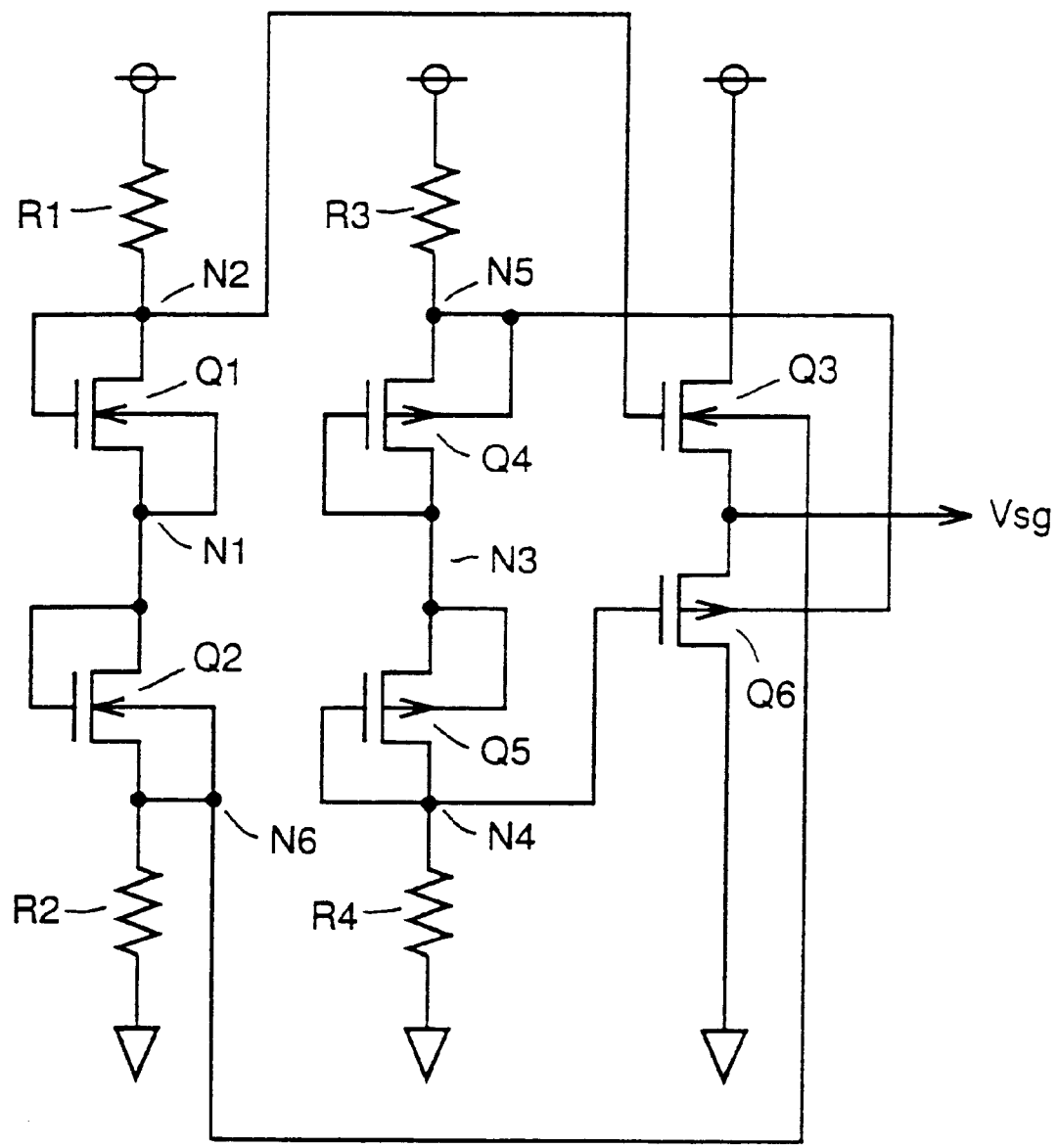
FIG. 2 is a circuit diagram showing a structure of the intermediate potential generation circuit of FIG. 1.

The intermediate potential generation circuit shown in FIG. 1 will be described in detail with reference to FIG. 2 showing a circuit diagram thereof.

Referring to FIG. 2, an intermediate potential generation circuit includes transistors Q1–Q3 which are n type MOSFETs, transistors Q4–Q6 which are p type MOSFETs, and resistors R1–R4.

Resistor R1 is connected to power supply voltage $V_{CC}$ and diode-connected transistor Q1. Transistor Q1 is connected to diode-connected transistor Q2. Transistor Q2 is connected to resistor R2. Resistor R2 is connected to ground potential GND. Transistor Q1 receives a substrate potential from a node N1. Transistor Q2 receives a substrate potential from a node N6.

Resistor R3 is connected to power supply voltage $V_{CC}$ and diode-connected transistor Q4. Transistor Q4 is connected to diode-connected transistor Q5. Transistor Q5 is connected to resistor R4. Resistor R4 is connected to ground potential GND. Transistor Q4 receives a substrate potential from a node N5. Transistor Q5 receives a substrate potential from a node N3.

Transistor Q3 is connected to power supply voltage $V_{CC}$ and transistor Q6. Transistor Q6 is connected to ground potential GND. The gate of transistor Q3 receives a potential of node N2. Transistor Q3 receives a substrate potential from node N6. The gate of transistor Q56 receives a potential of node N4. Transistor Q6 receives a substrate potential from node N5.

Figure 3:
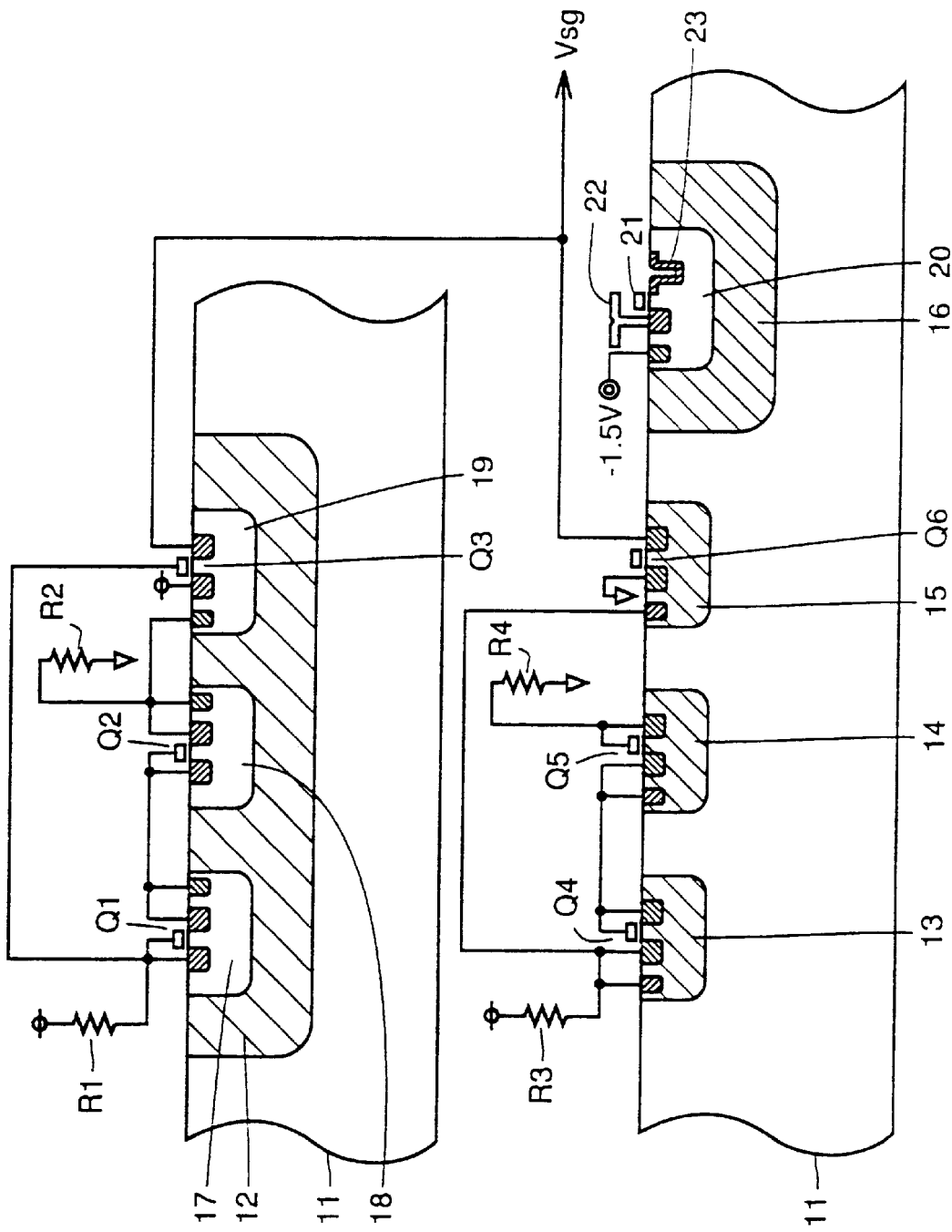
FIG. 3 schematically shows a structure of the intermediate potential generation circuit of FIG. 1.

FIG. 3 schematically shows a structure of the internal potential generation circuit of FIG. 2. In FIG. 3, components corresponding to those of FIG. 2 have the same reference characters denoted, and their description will not be repeated.

Referring to FIG. 3, the intermediate potential generation circuit further includes a p type substrate 11, n well layers 12–15, and p well layers 17–19. Also, a word line 21, a bit line 22, an n type diffusion layer 23 forming the capacitor of a memory cell, an well layer 16, and a p well layer 20 are shown. Here, p type substrate 11 is biased to 0 V. p well layer 20 forming a memory cell is isolated from p type substrate 11 by n well layer 16, and is biased to −1.5 V.

An operation of the above-structured intermediate potential generation circuit will be described hereinafter. The resistance of resistors R1 and R2 equal each other, and the resistance of resistors R3 and R4 equal each other. Resistors R1–R4 are high resistors, each having a resistance of several MΩ. Therefore, the current flow in transistors Q1, Q2, Q4 and Q5 is low, so that these transistors conduct lightly. Therefore, the potential of the gate-source of transistors Q1, Q2, Q4 and Q5 is equal to the threshold voltage of each transistor. As a result, the potential of node N1 is $V_{CC}/2$. The potential of node N2 is $V_{CC}/2+V_{TH1}$ ($V_{TH1}$ is the threshold voltage of transistor Q1). The potential of node N6 is $V_{CC}/2-V_{TH2}$ ($V_{TH2}$ is the threshold voltage of transistor Q2). The potential of node N3 is $V_{CC}/2$. The potential of node N4 is $V_{CC}/2-|V_{TH5}|$ ($V_{TH5}$ is the threshold voltage of transistor Q5). The potential of node N5 is $V_{CC}/2+|V_{TH4}|$ ($V_{TH4}$ is the threshold voltage of transistor Q4). Therefore, transistor Q3 conducts to raise the potential of output signal $V_{sg}$ when the potential of output signal $V_{sg}$ is lower than $V_{CC}/2+V_{TH1}-V_{TH3}$ ($V_{TH3}$ is the threshold voltage of transistor Q3). When the potential of output signal $V_{sg}$ is higher than $V_{CC}/2-|V_{TH5}|+V_{TH6}|$ ($V_{TH6}$ is the threshold voltage of transistor Q6), transistor Q6 conducts to reduce the potential of output signal $V_{sg}$. According to the structure shown in FIG. 2, the source-substrate potentials of transistors Q1, Q3, Q5, and Q6 are 0 V, $V_{TH2}$, 0 V and $-|V_{THX4}|$, respectively. By the substrate bias effect, the threshold voltage $V_{TH3}$ of transistor Q3 is higher than the threshold voltage $V_{TH1}$ of transistor Q1, and the absolute value of the threshold voltage $|V_{TH6}|$ of transistor Q3 is higher than the absolute value of the threshold voltage $|V_{TH5}|$ of transistor Q5. As a result, transistors Q3 and Q6 will not conduct together, so that a through current will not flow. Therefore, power consumption of the device can be reduced.

Additional manufacturing steps will not be required since n well layer 12 enclosing p well layers 17–19 can be manufactured at the same step of forming n well layer 19 enclosing p well layer 20 that implements a memory cell.

Figure 4:
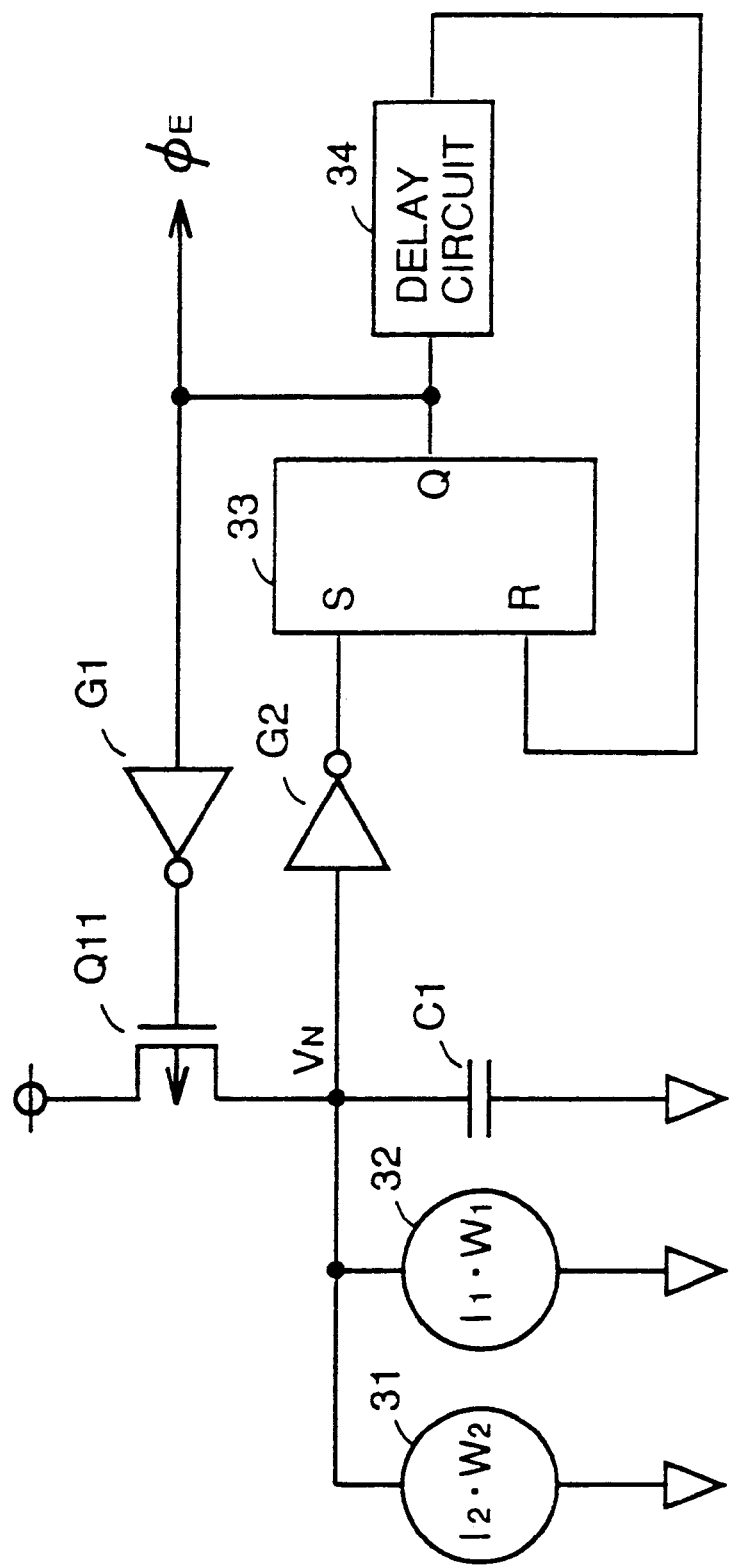
FIG. 4 shows a structure of the self refresh timer circuit of FIG. 1.

The self refresh timer circuit of FIG. 1 will be described hereinafter with reference to FIG. 4 showing a structure thereof.

Referring to FIG. 4, a self refresh timer circuit includes a transistor Q11 which is a p type MOSFET, a capacitor C1, inverters G1 and G2, current sources 31 and 32, a S-R flipflop 33, and a delay circuit 34.

Transistor Q11 is connected to power supply voltage $V_{CC}$, capacitor C1, current sources 31 and 32, and inverter G2. Capacitor C1 and current sources 31 and 32 are connected to ground potential GND. Inverter G2 is connected to a set terminal S of S-R flipflop 33. An output terminal Q of S-R flipflop 33 is connected to delay circuit 34 and inverter G1. Delay circuit 34 is connected to a reset terminal R of S-R flipflop 33. Inverter G1 is connected to the gate of transistor Q11.

When potential $V_N$ held by capacitor C1 becomes lower than a predetermined value, and inverter G2 attains a H level, S-R flipflop 33 is set to provide an output signal $\phi_E$ of a H level. Output signal $\phi_E$ is applied to inverter G1, whereby the output signal of inverter G1 attains a L level. Here, transistor Q11 attains a conductive state, whereby the holding potential $V_N$ of capacitor C1 rises. Output signal $\phi_E$ is applied to delay circuit 34 to be delayed for a predetermined time. The delayed output signal is applied to reset terminal R of S-R flipflop 33. As a result, S-R flipflop 33 is reset, and output signal $\phi_E$ is pulled down to a L level. This causes transistor Q11 to attain a non-conductive state, and holding voltage $V_N$ of capacitor C1 is reduced by current sources 31 and 32. When the holding voltage $V_N$ of capacitor C1 becomes lower than a predetermined potential, a similar operation is repeated to provide an output signal $\phi_E$ at a predetermined period.

Figure 5B:
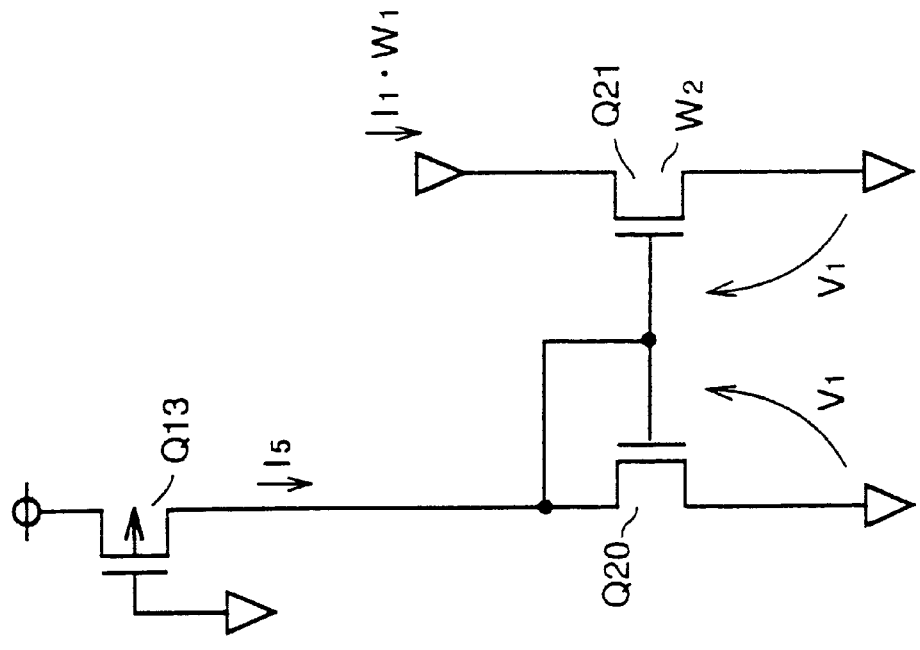
FIGS. 5A and 5B are circuit diagrams showing a structure of first and second current sources of FIG. 4.
Figure 5A:
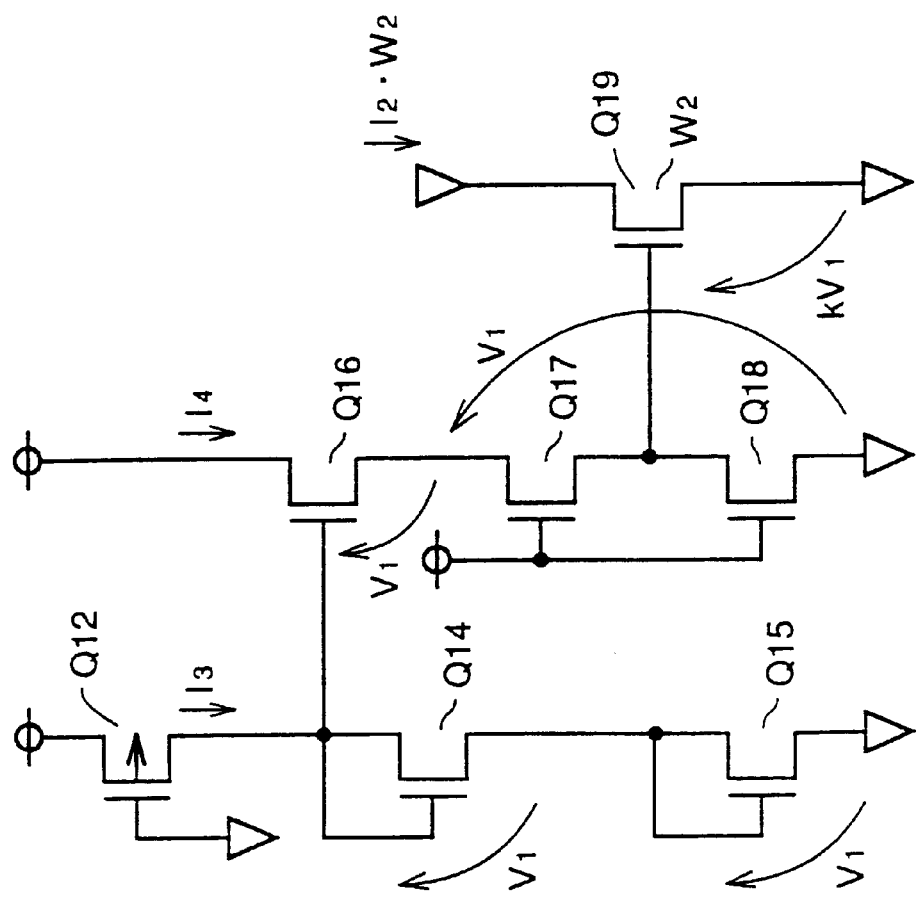

First and second current sources of FIG. 4 will be described hereinafter with reference to FIGS. 5A and 5B showing a circuit diagram thereof.

Referring to FIGS. 5A and 5B, a first current source includes a transistor Q12 which is a p type MOSFET, and transistors Q14–Q19 which are n type MOSFETs. A second current source includes a transistor Q13 which is a p type MOSFET, and transistors Q20 and Q21 which are n type MOSFETs.

Transistor Q12 is connected to power supply voltage $V_{CC}$ and diode-connected transistor Q14. The gate of transistor Q12 is connected to ground potential GND. Transistor Q14 is connected to diode-connected transistor Q15. Transistor Q15 is connected to ground potential GND. Transistor Q16 is connected to power supply voltage $V_{CC}$ and transistor Q17. The gate of transistor Q16 is connected to the node of transistors Q12 and 14. Transistor Q17 is connected to transistor Q18. The gates of transistors Q17 and Q18 are connected to power supply voltage $V_{CC}$. Transistor Q18 is connected to ground potential GND. Transistor Q19 is connected to ground potential GND. The gate of transistor Q19 is connected to the node of transistors Q17 and Q18.

Transistor Q13 is connected to power supply voltage $V_{CC}$ and diode-connected transistor Q20. Transistor Q20 is connected to ground potential GND. Transistor Q21 is connected to ground potential GND. The gate of transistor Q21 is connected to the gate of transistor Q20.

Each of transistors Q12, Q13, Q17 and Q18 has a long gate and an extremely low conductance. The channel length is set so that the current density $I_3$ of the current flowing in transistors Q12, Q14 and Q15, the current density $I_4$ of the current flowing in transistors Q16, Q17 and Q18, and the current density $I_5$ of the current flowing in transistor Q20 are substantially equal to each other, and take a low value of $I_0$. Therefore, each gate-source voltage $V_1$ of transistors Q14, Q15, Q16 and Q20 become equal. A current density is the drain current per gate unit width. Because the drain voltage of transistor Q17 is $V_1$, the gate potential of transistor Q19 takes a value of $kV_1$ (k is the division rate) which is a division by the resistance of each channel of transistors Q17 and Q18.

Figure 6:
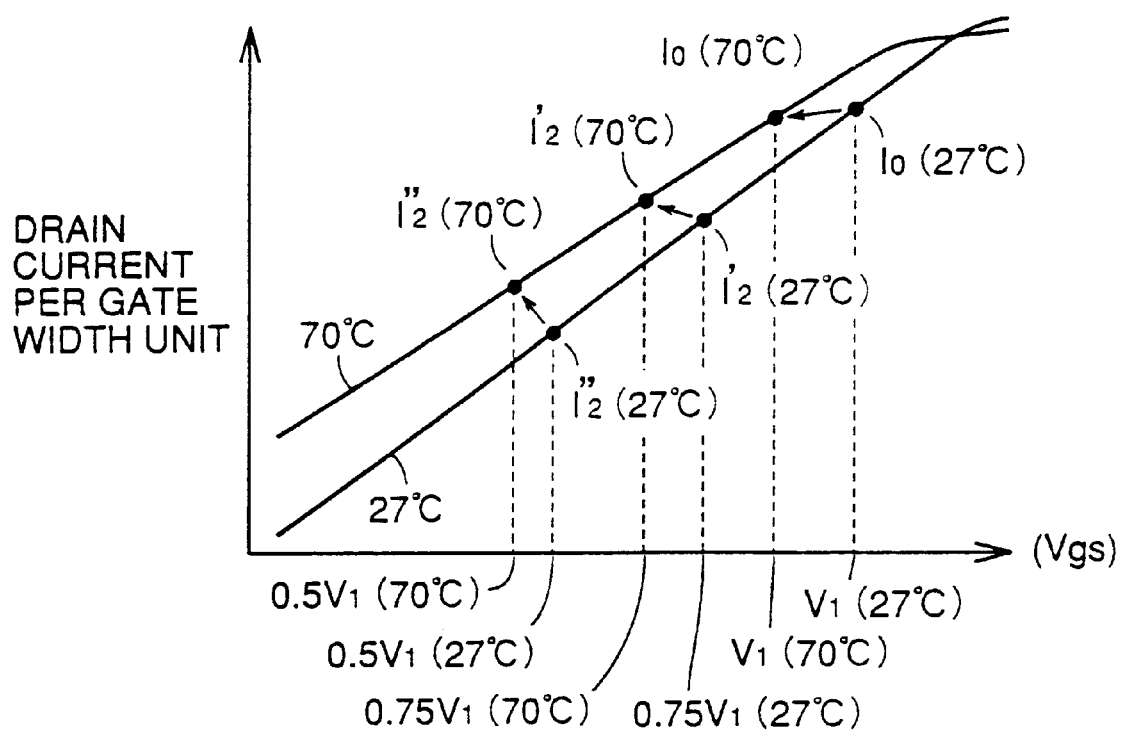
FIG. 6 is a diagram showing the relationship between the gate-source voltage and the drain current per gate width unit.

The relationship between the gate-source voltage $V_{gs}$ and the drain current per gate width unit length will be described hereinafter with reference to FIG. 6.

If the value of current density $I_0$ at 27° C. is $I_0$ (27° C.), the gate-source voltage is $V_1$ (27° C.). When the temperature rises to 70° C., the current flow in transistors Q12 and Q13 is reduced because the mobility of holes becomes smaller. Therefore, the value of $I_0$ at 70° C. becomes slightly lower than that at 27° C. Because the drain-source voltage is $kV_1$, the current density $I_2$ of transistor $Q_{19}$ becomes $I'_2$ (27° C.) at 27° C., and $I'_2$ (70° C.) at 70° C. when k=0.75. When k=0.5, the current density is $I''_2$ (27° C.) at 27° C., and $I''_2$ (70° C.) at 70° C. Therefore, the current density $I_2$ of transistor Q19 becomes higher at a higher temperature, and the rate of change thereof varies according to the value of k. As a result, current density $I_2$ in transistor Q19 can be set to a desired value by setting division rate k to a predetermined value.

The period T of a self refresh timer is:

$$T=(V_{CC}/2)\cdot C/(I_2\cdot W_2+I_1\cdot W_1)+Td$$

where C is the capacitance of capacitor C1, $V_{CC}/2$ is the threshold voltage of inverter G2, $W_2$ is the channel width of transistor Q19, $W_1$ is the channel width of transistor Q21, $I_2$ is the current density of transistor Q19, and $I_1$ is the current density of transistor Q21. Therefore, the period T of the self refresh timer can be set to an arbitrary value taking into consideration temperature dependency by varying the division rate k, and the channel widths $W_1$ and $W_2$. Because the current $I_1$, has weaker dependence on temperature than the current $I_2$, the refresh period is limited to $T=(V_{CC}/2)\cdot C/(I_1\cdot W_1)+Td$ at low temperature. Thus, generation of soft error can be prevented even at low temperature.

Figure 7:
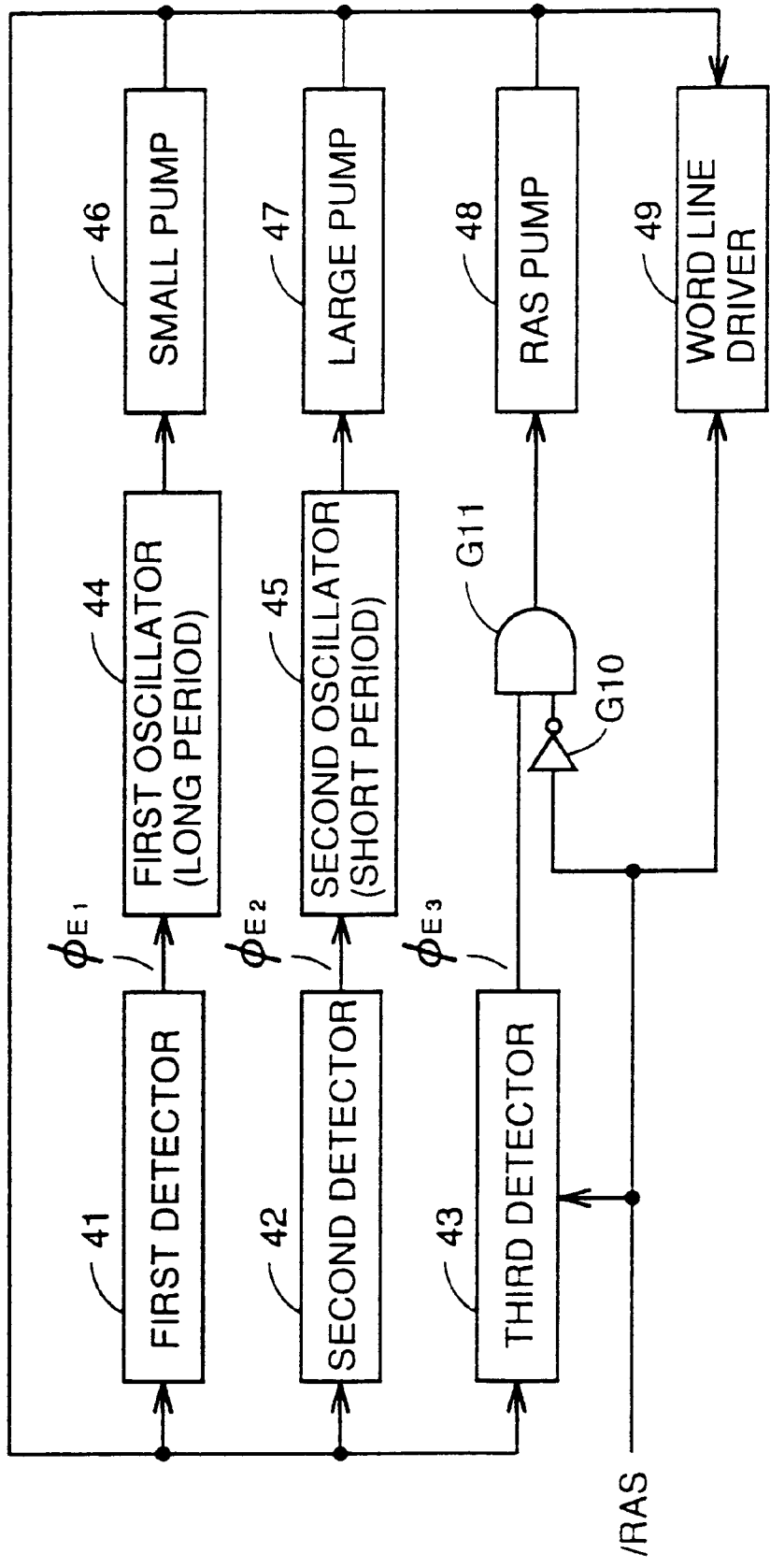
FIG. 7 is a block diagram showing a structure of the internal high voltage circuit of FIG. 1.

Internal high voltage circuit 4 of FIG. 1 will be described hereinafter with reference to FIG. 7 showing a block diagram thereof.

Referring to FIG. 7, an internal high voltage circuit 4 includes a first detector 41, a second detector 42, a third detector 43, a first oscillator 44, a second oscillator 45, a small pump 46, a large pump 47, a RAS pump 48, an AND gate G11 and an inverter G10.

First detector 41 detects the potential of high voltage $V_{PP}$ supplied to a word line driver 49. If high voltage $V_{PP}$ is lower than a predetermined value, an output signal $\phi_{E1}$ of a H level is provided to first oscillator 44. First oscillator 44 oscillates when output signal $\phi_{E1}$ attains a H level, and provides a clock signal of a long period to small pump 46. Small pump 46 is driven by a clock signal from first oscillator 44 to provide high voltage $V_{PP}$ to word line driver 49. Therefore, the leakage current during standby is replenished.

Second detector 42 detects the potential of high voltage $V_{PP}$ supplied to word line driver 49. If high voltage $V_{PP}$ is lower than a predetermined value, an output signal $\phi_{E2}$ of a H level is provided to second oscillator 45. Second oscillator 45 oscillates when output signal $\phi_{E2}$ attains a H level to provide a clock signal of a short period to large pump 47. Large pump 47 is driven by a clock signal from second oscillator 45 to supply high voltage $V_{PP}$ to word line driver 49. Thus, high voltage $V_{PP}$ is rapidly raised in turning on the power supply.

Third detector 43 detects the potential of high voltage $V_{PP}$ supplied to word line driver 49. When high voltage $V_{PP}$ is lower than a predetermined value, an output signal $\phi_{E3}$ of a H level is provided to an AND gate 11 in response to row address strobe signal/RAS. Row address strobe signal/RAS is applied to AND gate G11 via inverter G10 to provide to RAS pump 48 a logical product of an inverted signal of row address strobe signal/RAS and output signal $\phi_{E3}$ as an output signal. RAS pump 84 responds to an output signal of AND gate G11 to supply high voltage $V_{PP}$ to word line driver 49. More specifically, row address strobe signal/RAS attains a L level, whereby the device operates to replenish high voltage $V_{PP}$ which is consumed when the word line is raised to the level of high voltage $V_{PP}$.

First and second detectors of FIG. 7 will be described hereinafter with reference to FIG. 8.

Figure 8:
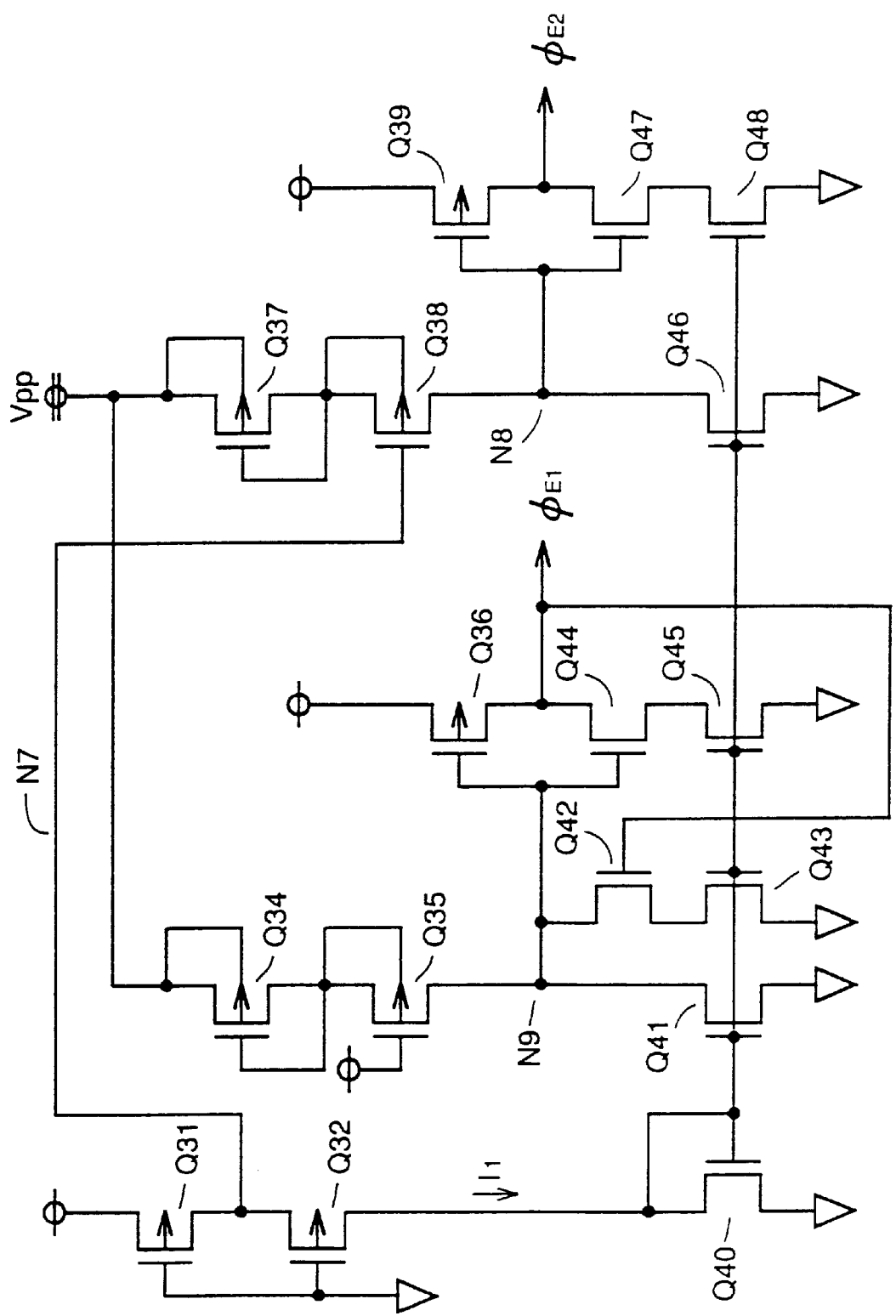
FIG. 8 is a circuit diagram showing a structure of the first and second detectors of FIG. 7.

Referring to FIG. 8, the first and second detectors include transistors Q31–Q39 which are p type MOSFETs, and transistors Q40–48 which are n type MOSFETs.

Transistor Q31 is connected to power supply voltage $V_{CC}$ and transistor Q32. Transistor Q32 is connected to diode-connected transistor Q40. Transistors Q31 and Q32 have their gates connected to ground potential GND. Transistor Q40 is connected to ground potential GND. Diode-connected transistor Q34 is connected to high voltage $V_{PP}$ and transistor Q35. Transistor Q35 is connected to transistor Q41. Transistor Q35 has its gate connected to power supply voltage $V_{CC}$. Transistor Q41 is connected to ground potential GND. Transistor Q42 is connected to the node between transistors Q35 and Q41, and to transistor Q43. Transistor Q43 is connected to ground potential GND. Transistor Q36 is connected to power supply voltage $V_{CC}$ and transistor Q44. Transistor Q44 is connected to transistor Q45. Transistor Q45 is connected to ground potential GND. Transistors Q36 and Q44 have their gates connected to the node between transistors Q35 and Q41. Transistor Q42 has its gate connected to the node between transistors Q36 and Q44.

Diode-connected transistor Q37 is connected to high voltage $V_{PP}$ and transistor Q38. Transistor Q38 is connected to transistor Q46. Transistor Q46 is connected to ground potential GND. Transistor Q38 has its gate connected to the node between transistors Q31 and Q32. Transistor Q39 is connected to power supply voltage $V_{CC}$ and transistor Q47. Transistor Q47 is connected to transistor Q48. Transistors Q39 and Q47 have their gates connected to the node between transistors Q38 and Q46. Transistor Q48 is connected to ground potential GND. Transistor Q40 has its gate connected to each gate of transistors Q41, Q43, Q45 and Q46, and Q48.

The operation of the above-structured first and second detectors will be described hereinafter.

Transistors Q31 and Q32 having a long channel, and conduct a slight current $I_1$. Because the channel width and the channel length of each of transistors Q40, Q41, Q43, Q45, Q46 and Q48 are the same, the mirror current flowing in each transistor is limited to $I_1$. The potential of node N7 is reduced by $\Delta V$ due to the channel resistance of transistor Q31, i.e., $V_{CC}-\Delta V$. Therefore, when the potential of high voltage $V_{PP}$ becomes higher than $V_{CC}-\Delta V+2|V_{THP}|$ ($V_{THP}$ is the threshold voltage of transistors Q37 and Q38), the current in transistors Q37 and Q38 becomes greater than the current $I_1$ discharged by transistor Q46. Therefore, the potential of node N8 rises to cause output signal $\phi_{E2}$ to attain a L level. Accordingly, when power is turned on, large pump 47 operates until the level of high voltage $V_{PP}$ becomes higher than $V_{CC}-\Delta V+2|V_{THP}|$. When high voltage $V_{PP}$ becomes higher than $V_{CC}-\Delta V+2|V_{THP}|$, only small pump 46 operates. Then, when high voltage $V_{PP}$ becomes higher than $V_{CC}+2|V_{THP}|$, a current greater than the current $I_0$ discharged by transistors Q41, Q42 and Q43 flow in transistors Q34 and Q35 because the gate potential of transistor Q35 is the power supply voltage $V_{CC}$. This causes the potential of node N9 to increase, whereby output signal $\phi_{E1}$ attains a L level. First oscillator 44 ceases to suppress operation of small pump 46. Then, when output signal $\phi_{E1}$ attains a H level, transistor Q42 attains a non-conductive state. Therefore, the current supplied via transistors Q34 and Q35 become smaller than the current $I_0$ drawn by transistor Q41, whereby high voltage $V_{PP}$ is reduced. This reduction in high voltage $V_{PP}$ causes the potential of node N9 to be reduced, whereby output signal $\phi_{E1}$ attains a H level to restart the operation of small pump 46.

Because first and second detectors have the through current in transistors Q36, Q44, Q39 and Q47 limited to $I_1$ by the current mirror formed of transistor Q40 and transistors Q45 and Q48, power consumption is reduced to realize reduction in power consumption of the device. Furthermore, because the gate potential of transistor Q38 is set to $V_{CC}-\Delta V$ which is slightly lower than $V_{CC}$ by the resistance division of transistors Q31 and Q32, the level of high voltage $V_{PP}$ becomes $V_{CC}+2|V_{THP}|$ at the time of standby, and $V_{CC}-\Delta V+2|V_{THP}|$ at the time of an active state, allowing reduction in the difference therebetween. Therefore, variation in the level of high voltage $V_{PP}$ can be reduced.

The third detector of FIG. 7 will be described hereinafter with reference to the circuit diagram of FIG. 9.

Figure 9:
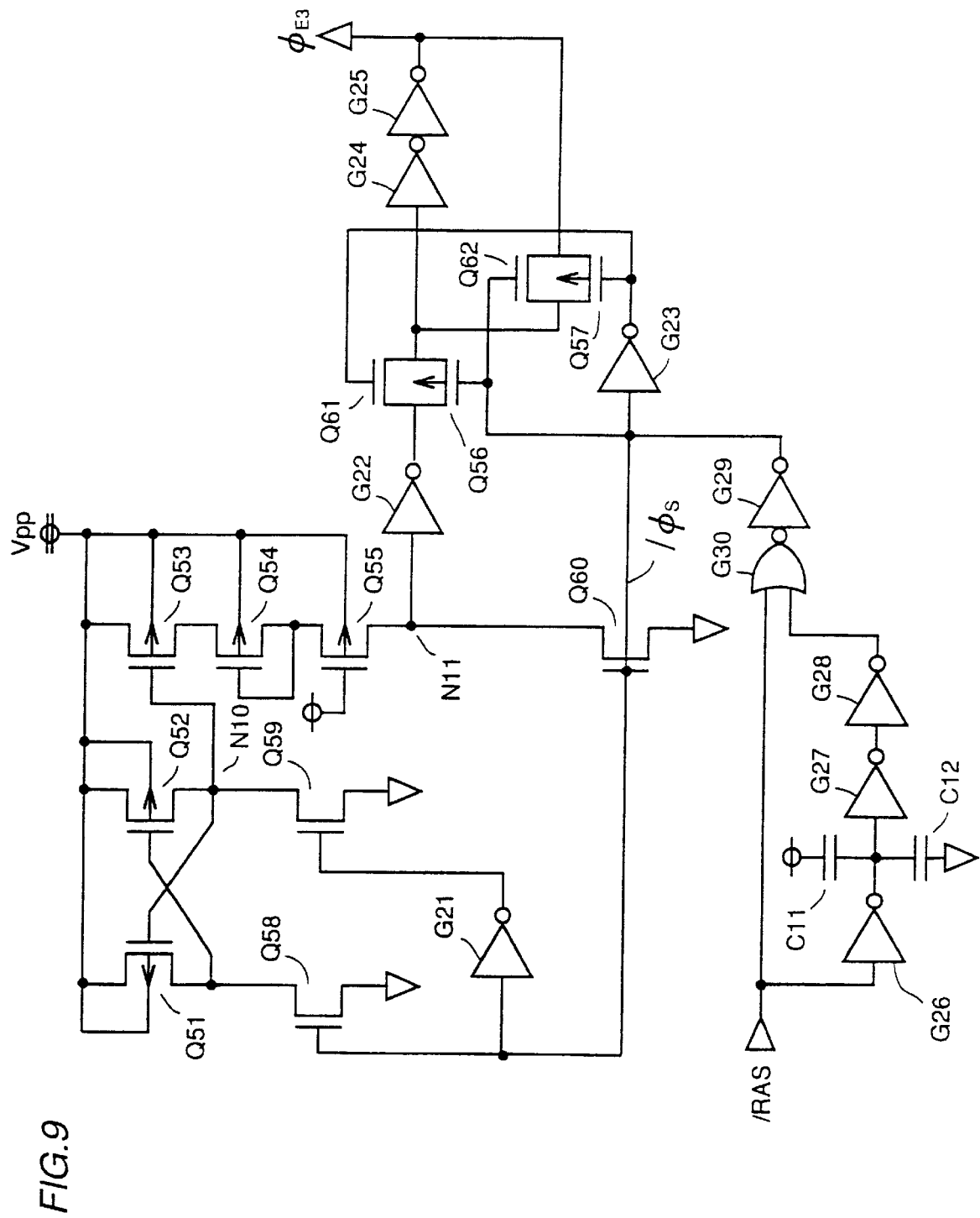
FIG. 9 is a circuit diagram showing a structure of the third detector of FIG. 7.

Referring to FIG. 9, the third detector includes transistors Q51–Q57 which are p type MOSFETS, transistors Q58–Q61 which are n type MOSFETs, inverters G21–G29, an NOR gate G30, and capacitors C11 and C12.

Transistor Q51 is connected to high voltage $V_{PP}$ and transistor Q58. Transistor Q58 is connected to ground potential GND. Transistor Q52 is connected to high voltage $V_{PP}$ and transistor Q59. Transistor Q59 is connected to ground potential GND. Transistor Q51 has its gate connected to the node between transistors Q52 and Q59. Transistor Q52 has its gate connected to the node between transistors Q51 and Q58. Transistor Q53 is connected to high voltage $V_{PP}$ and diode-connected transistor Q54. Transistor Q54 is connected to transistor Q55. Transistor Q55 is connected to transistor Q60 and inverter G22. Transistor Q60 is connected to ground potential GND. Transistor Q58 has its gate connected to the gate of transistor Q60 and inverter G23, and further to the gate of transistor Q59 via inverter G21. Transistor Q53 has its gate connected to the node between transistors Q52 and Q59. Transistor Q55 has its gate connected to power supply voltage $V_{CC}$. Inverter G22 is connected to transistors Q61 and Q56. Transistors Q61 and Q56 are connected to transistors Q62 and Q57, and inverter G24. Inverter G24 is connected to inverter G25. Inverter G25 is connected to transistors Q62 and Q57. Inverter G23 is connected to the gate of transistor Q61 and the gate of transistor Q57. Transistors Q57 and Q62 have their gates connected to the gate of transistor Q60. Row address strobe signal/RAS is applied to NOR gate G30 and inverter G26. Inverter G26 is connected to capacitors C11, C12, and inverter G27. Capacitor C11 is connected to power supply voltage $V_{CC}$. Capacitor C12 is connected to ground potential GND. Inverter G27 is connected to inverter G28. Inverter G28 is connected to NOR gate G30. NOR gate G30 is connected to inverter G29.

An operation of the above-described structured third detector will be described hereinafter with reference to the timing charts of FIGS. 10(a) to 10(c). When row address strobe signal/RAS is logical low, a sampling pulse/$\phi_s$ attains a L level for a predetermined time period. Here, node N10 is pulled down to a L level, whereby transistor Q53 attains a conductive state, and transistor Q60 attains a non-conductive state. Then, when the potential of high voltage $V_{PP}$ becomes higher than $V_{CC}+2|V_{THP}|$ ($V_{THP}$ is the threshold voltage of transistors Q53, Q54), node N11 attains a H level. Here, a latch circuit formed of transistors Q61, Q56, Q62, and Q57 and inverters G24 and G25 latches a signal of a L level, whereby output signal $\phi_{E3}$ attains a L level. When the potential of high voltage $V_{PP}$ becomes lower than $V_{CC}+2|V_{THP}|$, node N11 attains a L level, whereby a signal of a H level is latched in the above-described latch circuit. As a result, output signal $\phi_{E3}$ attains a H level. Therefore, the third detector operates in response to the fall of row address strobe signal/RAS. No power is consumed when row address strobe signal/RAS attains a H level. Therefore, reduction in power consumption can be realized during standby.

FIGS. 11(a) to 11(c) are graphs showing the change of the level in high voltage $V_{PP}$ with respect to output signal $\phi_{E3}$ of the third detector. It is appreciated from FIGS. 11(a) to 11(c) that output signal $\phi_{E3}$ attains a H level to operate RAS pump 48 when the potential of high voltage $V_{PP}$ becomes lower than, for example, 4.8 V, when row address strobe signal/RAS is pulled down to a L level. Therefore, the third detector does not consume power during standby, and operates in response to row address strobe signal/RAS during an active state. Therefore, a high speed response is possible. Thus, variation in the level of high voltage $V_{PP}$ is reduced, allowing provision of a stable high voltage $V_{PP}$.

The first oscillator of FIG. 7 will be described hereinafter with reference to the circuit diagram of FIG. 12.

Figure 12:
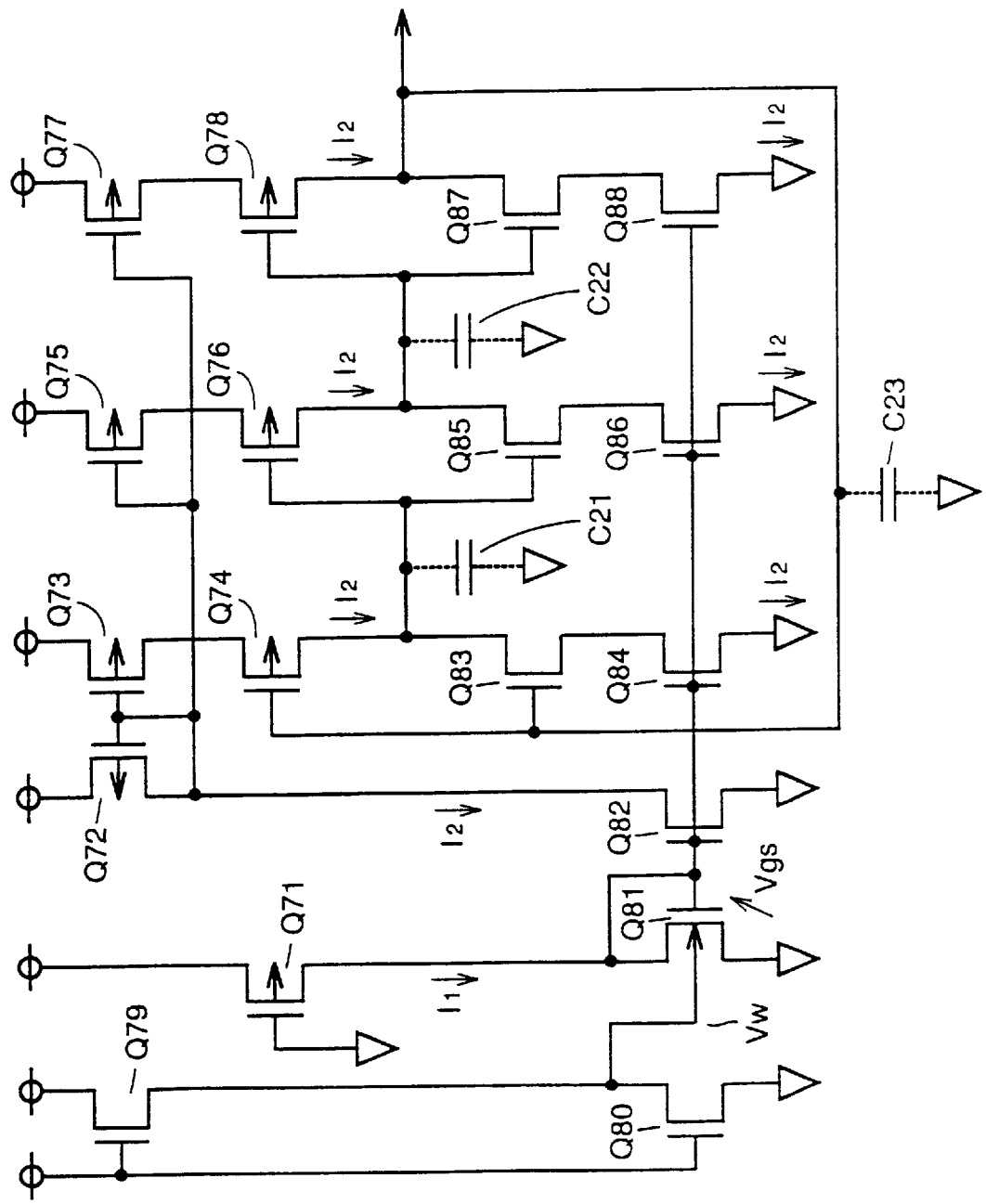
FIG. 12 is a circuit diagram showing a structure of the first oscillator of FIG. 7.

Referring to FIG. 12, the first oscillator includes transistors Q71–Q78 which are p type MOSFETs, and transistors Q79–Q88 which are n type MOSFETs. C21–C23 shown in FIG. 12 are parasitic capacitances.

Transistors Q79 is connected to power supply voltage $V_{CC}$ and transistor Q80. Transistor Q80 is connected to ground potential GND. Transistors Q79 and Q80 have their gates connected to power supply voltage $V_{CC}$. Transistors Q71 is connected to power supply voltage $V_{CC}$ and diode-connected transistor Q81. Transistor Q81 is connected to ground potential GND. Transistor Q71 has its gate connected to ground potential GND. Transistor Q72 is connected to power supply voltage $V_{CC}$ and transistor Q82. Transistor Q82 is connected to ground potential GND. Transistor Q73 is connected to power supply voltage $V_{CC}$ and transistor Q74. Transistor Q74 is connected to transistor Q83. Transistor Q83 is connected to transistor Q84. Transistor Q84 is connected to ground potential GND. Transistor Q75 is connected to power supply voltage $V_{CC}$ and transistor Q76. Transistor Q76 is connected to transistor Q85. Transistor Q85 is connected to transistor Q86. Transistor Q86 is connected to ground potential GND. Transistor Q77 is connected to power supply voltage $V_{CC}$ and transistor Q78. Transistor Q78 is connected to transistor Q87. Transistor Q87 is connected to transistor Q88. Transistor Q88 is connected to ground potential GND. Transistors Q72, Q73, Q75 and Q77 have their gates connected to each other, and also connected to the node between transistors Q72 and Q82. Transistors Q74 and Q83 have their gates connected to the node between transistors Q78 and Q87. Transistors Q76 and Q85 have their gates connected to the node between transistors Q74 and Q83. Transistors Q78 and Q87 have their gates connected to the node between transistors Q76 and Q85. Transistors Q81, Q82, Q84, Q86, and Q88 have their gates connected to each other.

An operation of the above-structured first oscillator will be described hereinafter. According to the above-described structure, the first oscillator forms a ring oscillator, and oscillates at a predetermined frequency. Each of transistors Q79 and Q80 have a long channel, and divides power supply voltage $V_{CC}$ by each channel resistance. Assuming that the division rate of power supply voltage $V_{CC}$ is k, the substrate potential of transistor Q81 is $kV_{CC}$. By setting division rate k to 0.05, for example, the threshold voltage of transistor Q81 is reduced since the substrate potential of transistor Q81 rises with the increase of power supply voltage $V_{CC}$ even when the power supply voltage rises to increase the current $I_1$ flowing in transistor Q71. Because the gate-source voltage $V_{gs}$ of transistor Q81 is not increased, current $I_2$ flowing in transistors Q82, Q84, Q86, Q88 does not increase. Furthermore, the current in transistors Q73, Q75 and Q77 which is the mirror current flowing in transistors Q72 and Q82 does not increase. Although the delay time period of each inverter in the first oscillator is $3C/I_2$ where C is the level of parasitic capacitances C21–C23, an increase in the power supply voltage $V_{CC}$ does not cause change in the delay time period since current $I_2$ flowing in transistors Q84, Q86 and Q88 does not increase. Therefore, the oscillation frequency of the first oscillator does not increase, and oscillates at a predetermined period, even when power supply voltage $V_{CC}$ increases. Therefore, the power consumption is not increased. Thus, reduction in power consumption of the device can be realized.

The present invention is not limited to the above description of the first oscillator, and a similar effect can be obtained with a second oscillator of a structure identical to that of FIG. 12.

Another example of an internal high voltage circuit will be described hereinafter with reference to the block diagrams of FIG. 13.

Figure 13:
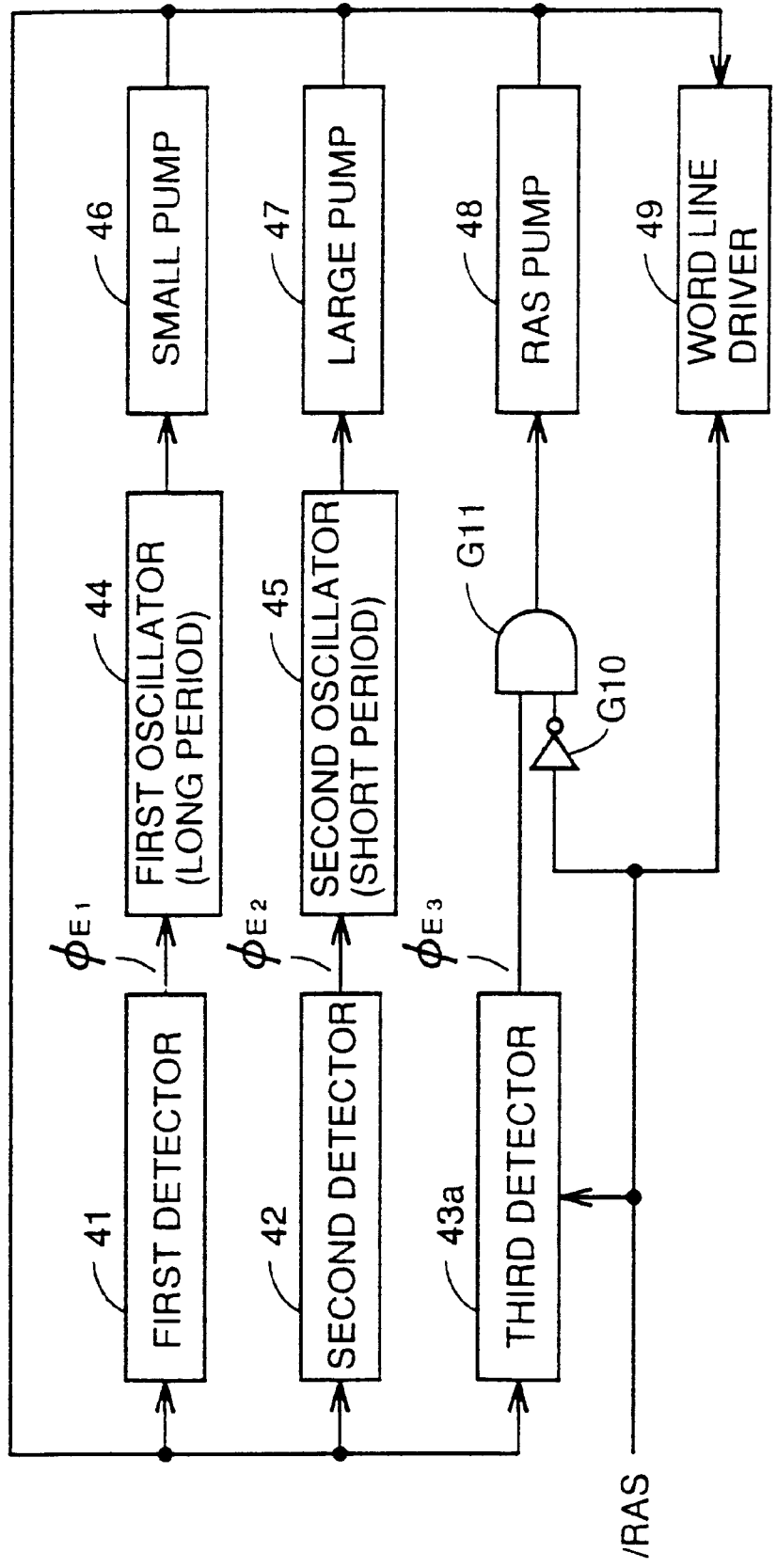
FIG. 13 is a block diagram showing another structure of the internal high voltage circuit of FIG. 1.

The internal high voltage of circuit of FIG. 13 differs from the internal high voltage circuit of FIG. 7 in that third detector 43 is modified into another third detector 43a. The remaining elements are similar to those of the internal high voltage circuit of FIG. 7 with the same reference characters denoted. Therefore, the description will not be repeated.

Figure 14:
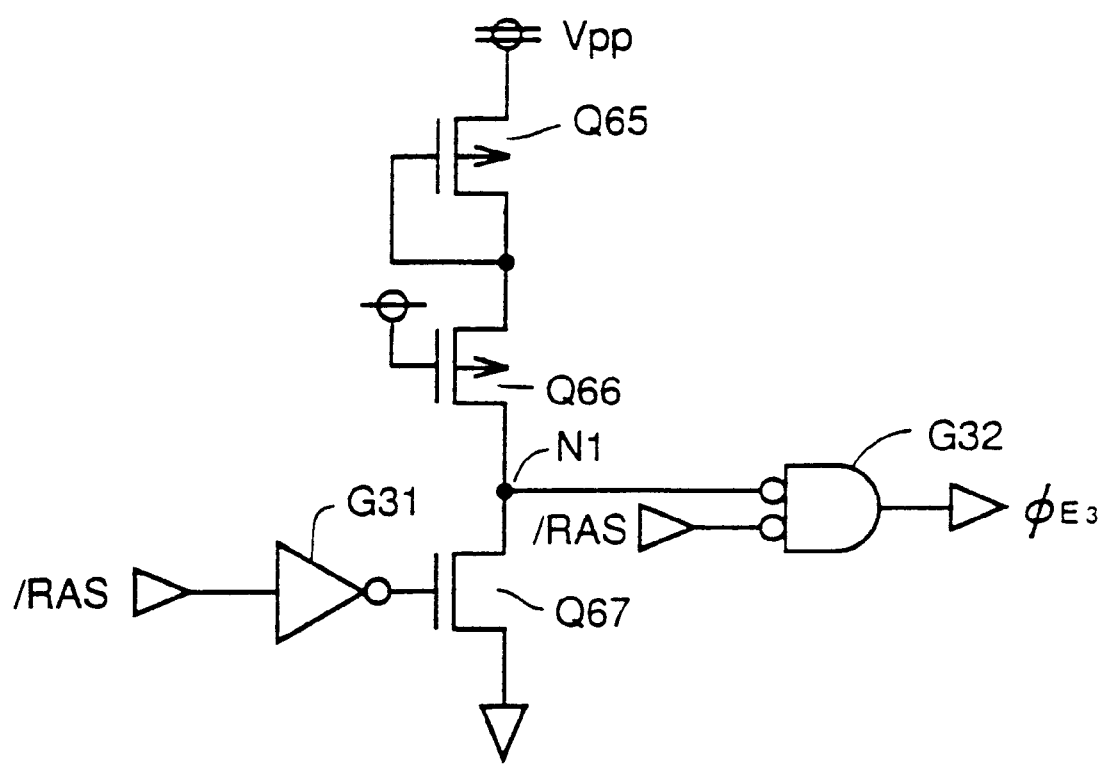
FIG. 14 is a circuit diagram showing a structure of the third detector of FIG. 13.

FIG. 14 is a circuit diagram showing a structure of the third detector of FIG. 13.

Referring to FIG. 14, a third detector 43a includes transistors Q65 and Q66 which are p type MOSFETs, a transistor Q67 which is an n type MOSFET, an inverter G31 and an NAND gate 32.

Diode-connected transistor Q65 is connected to high voltage $V_{PP}$ and transistor Q66. Transistor Q66 is connected to transistor Q67, and has its gate connected to power supply potential $V_{CC}$. Transistor Q67 is connected to ground potential GND. Inverter G31 receives row address strobe signal/RAS, and has the output side thereof connected to the gate of transistor Q67. NAND gate G32 receives an output signal of node N1 and row address strobe signal/RAS to provide an output signal $\phi_{E3}$.

Transistor Q67 has a short channel. The speed of the potential of node N1 pulled down to a L level from a H level when the level of high voltage $V_{PP}$ falls becomes faster during the time period of row address strobe signal/RAS attaining a L level. More specifically, the response of third detector 43a is speeded when row address strobe signal/RAS attains a L level. Therefore, power consumption during standby is not increased, and reduction in power consumption can be realized in the device.

A semiconductor device according to a second embodiment of the present invention will be described hereinafter.

Figure 15:
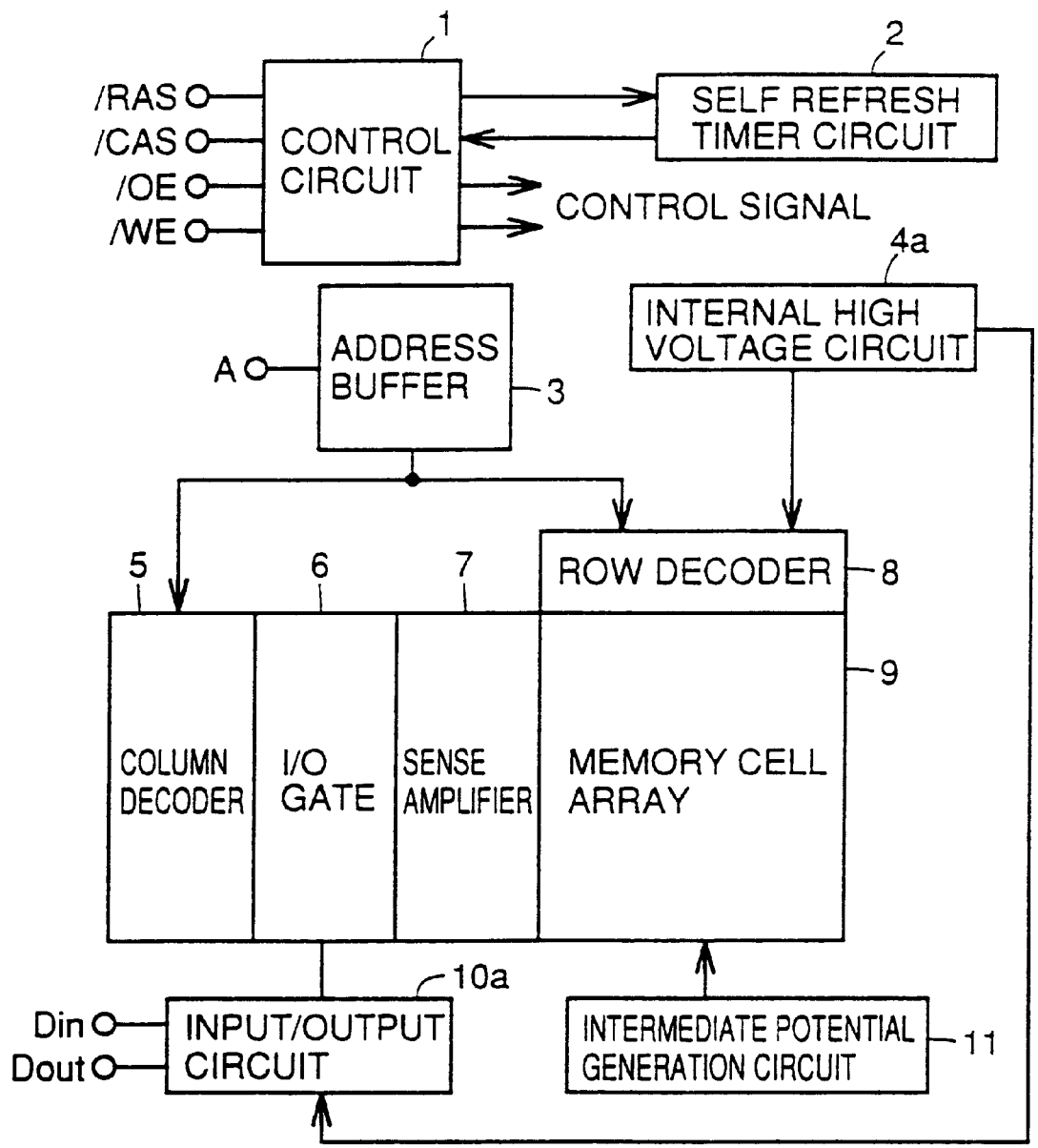
FIG. 15 is a block diagram showing a structure of a semiconductor device according to a second embodiment of the present invention.

FIG. 15 is a block diagram showing a structure of a DRAM which is the second embodiment of the present invention. The DRAM of FIG. 15 differs from the DRAM of FIG. 1 in that internal high voltage circuit 4 is modified to an internal high voltage circuit 4a, input/output circuit 10 is modified to another input/output circuit 10a, and that high voltage $V_{PP}$ is supplied from internal high voltage circuit 4a to input/output circuit 10a.

The other components of the DRAM of FIG. 15 are similar to those of FIG. 1, and have the same reference characters denoted. Therefore, their description will not be repeated.

Figure 16:
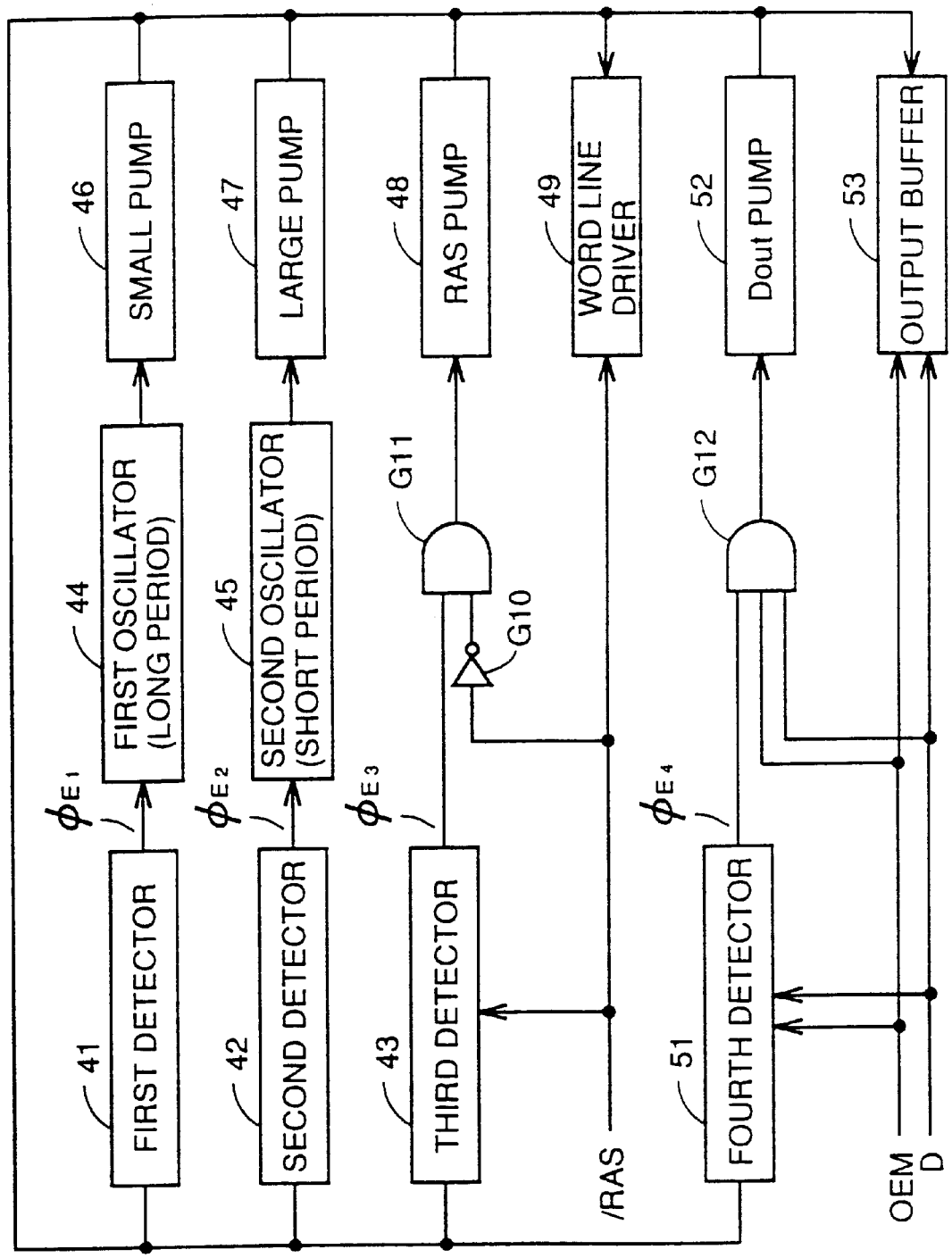
FIG. 16 is a block diagram showing one example of a structure of the internal high voltage circuit of FIG. 15.

FIG. 16 is a block diagram showing a structure of the internal high voltage circuit in FIG. 15. The internal high voltage circuit of FIG. 16 different from the internal high voltage circuit shown in FIG. 7 in that a fourth detector 51, a Dout pump 52, and an AND gate G12 are added. The remaining elements are similar to those of FIG. 7, and have the same reference characters denoted. Their description will not be repeated.

Fourth detection 51 detects the potential of high voltage $V_{PP}$ supplied to output buffer 53. When high voltage $V_{PP}$ is lower than a predetermined value, an output signal $\phi_{E4}$ of a H level is provided to AND gate G12 in response to an output buffer activation signal OEM and data signal D. AND gate G12 provides the logical product of output signal $\phi_{E4}$, output buffer activation signal OEM, and data signal D as an output signal to Dout pump 52. Dout pump 52 responds to an output signal of AND gate G12 to supply a high voltage $V_{PP}$ to output buffer 53.

The fourth detector shown in FIG. 16 will be described hereinafter with reference to the circuit diagram of FIG. 17.

Figure 17:
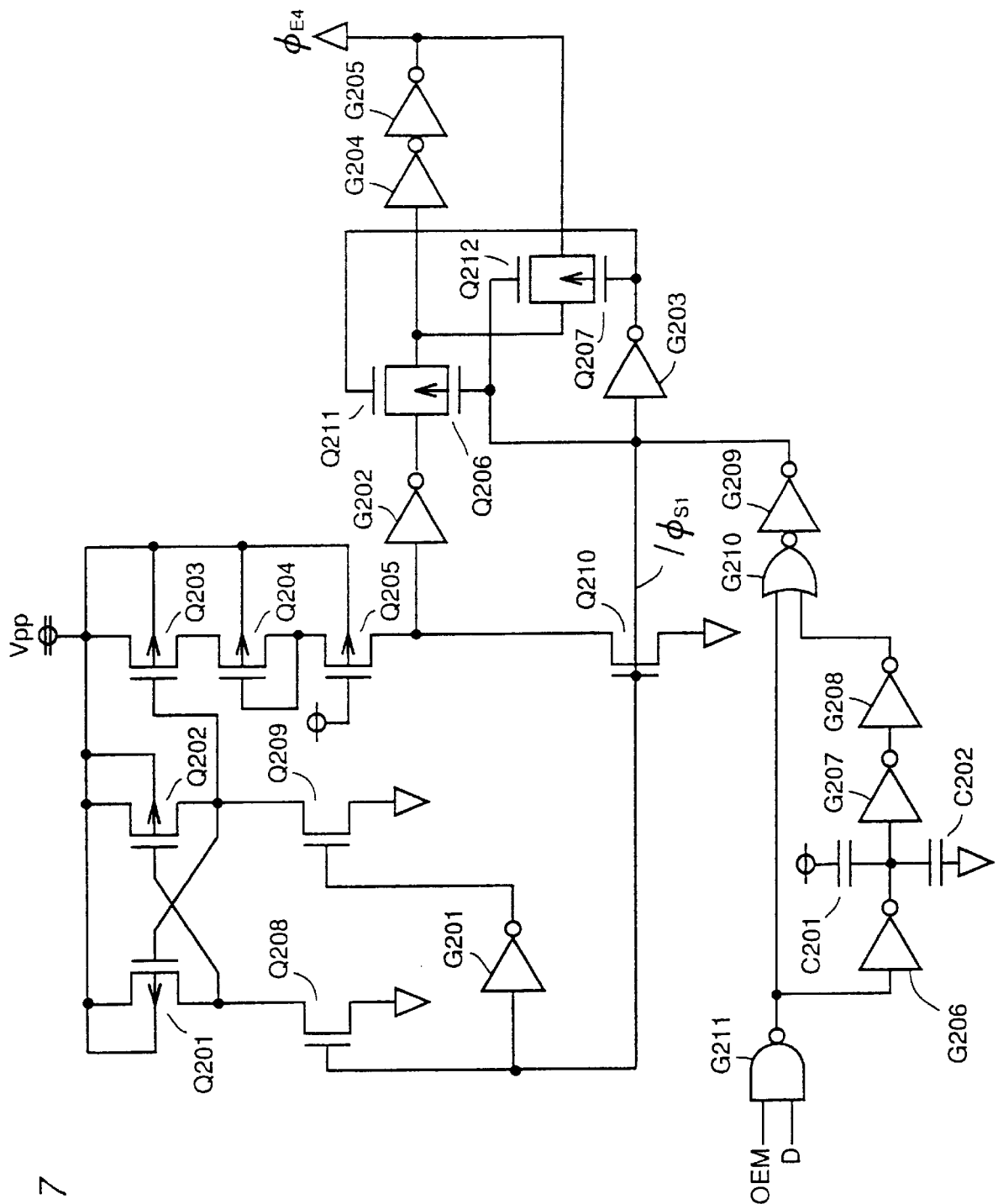
FIG. 17 is a circuit diagram showing a structure of the fourth detector of FIG. 16.

Referring to FIG. 17, the fourth detector includes transistors Q201–Q207 which are p type MOSFETS, transistors Q208–Q212 which are n type MOSFETs, inverters G201–G209, an NOR gate G210, an NAND gate G212, and capacitors C201 and C202.

Transistor Q201 is connected to high voltage $V_{PP}$ and transistor Q208. Transistor Q208 is connected to ground potential GND. Transistor Q202 is connected to high voltage $V_{PP}$ and transistor Q209. Transistor Q209 is connected to ground potential GND. Transistor Q201 has its gate connected to the node between transistors Q202 and Q209. Transistor Q202 has its gate connected to the node between transistors Q201 and Q208. Transistor Q208 has its gate connected to gate of transistor Q209 via inverter G201. Transistor Q203 is connected to high voltage $V_{PP}$ and diode-connected transistor Q204. Transistor Q205 is connected to transistor Q204, inverter G202, and transistor Q210. Transistor Q210 is connected to ground potential GND. Transistor Q203 has its gate connected to the node between transistors Q202 and Q209. Transistor Q205 has its gate connected to power supply potential $V_{CC}$. Transistor Q210 has its gate connected to the gate of transistor Q208. Inverter G202 is connected to transistors Q211 and Q206. Transistors Q211 and Q206 are connected to inverter G204. Inverter G204 is connected to inverter G205. Inverter G205 is connected to transistors Q212 and Q207. Transistors Q212 and Q207 are connected to transistors Q211 and Q206. Transistors Q206 and Q212 have their gates connected to the gate of transistor Q210. Transistors Q211 and Q207 have their gates connected to the gate of transistor Q210 via inverter G203. NAND gate G218 receives an output buffer activation signal OEM and data signal D. The output side of NAND gate G211 is connected to inverter G206, and NOR gate G210. Inverter G206 is connected to capacitors C201 and C202, and inverter G207. Capacitor C201 is connected to power supply potential $V_{CC}$. Capacitor C202 is connected to ground potential GND. Inverter G207 is connected to inverter G208. Inverter G208 is connected NOR gate G210. NOR gate G210 is connected to inverter G209. Inverter G209 is connected to the gate of transistor Q210. As described above, the fourth detector has a structure substantially similar to that of the third detector of FIG. 9. Responding to output buffer activation signal OEM and data signal D instead of row address strobe signals/RAS is the only difference in operation from the third detector of FIG. 9. Therefore, description of the operation will not be repeated.

Figure 18:
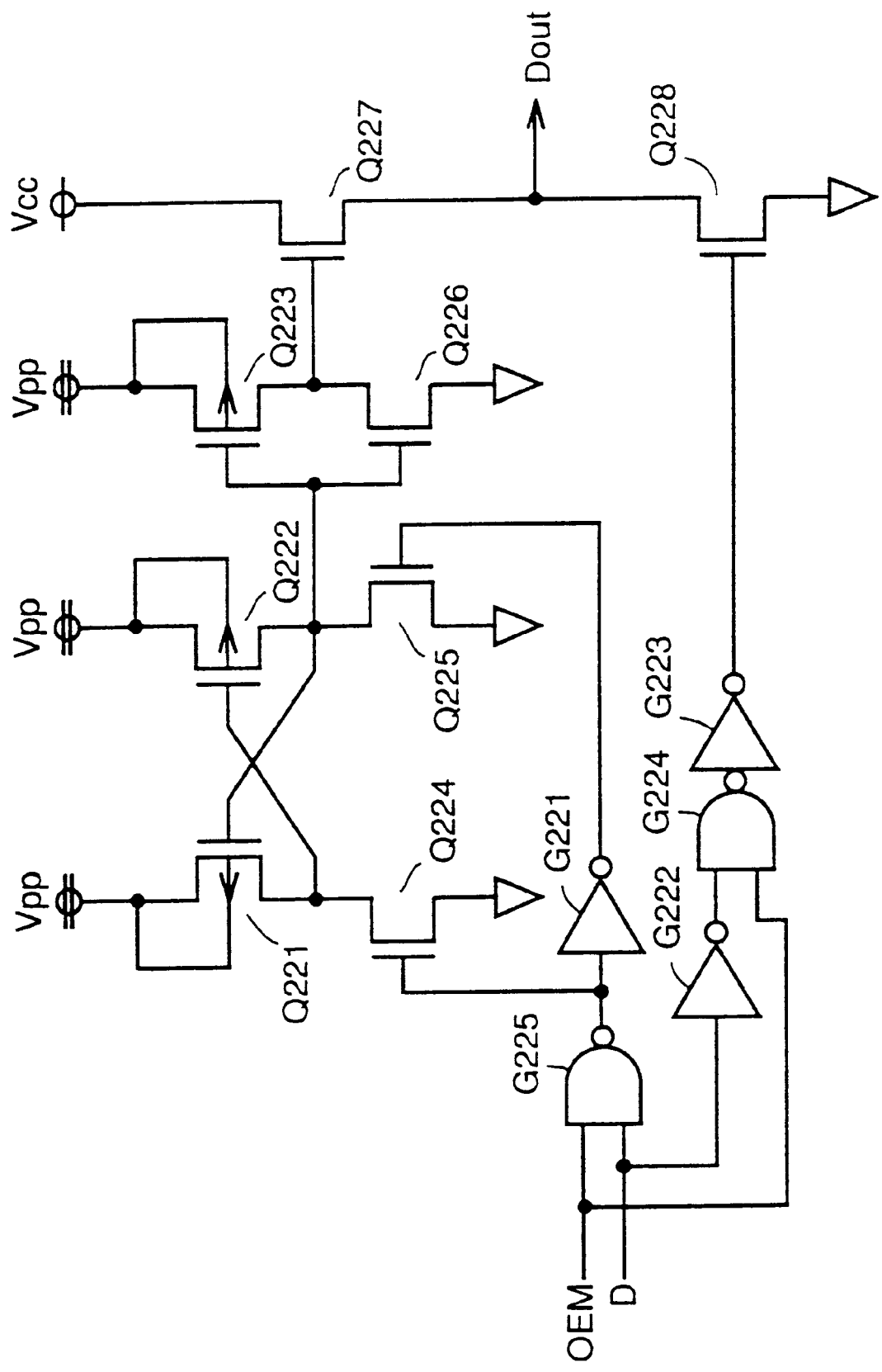
FIG. 18 is a circuit diagram showing a structure of the output buffer of FIG. 16.

Output buffer 53 of FIG. 16 will be described hereinafter. This is a portion of input/output circuit 10a of FIG. 15 relating to the operation of output. FIG. 18 is circuit diagram showing a structure of the output buffer of FIG. 16.

Referring to FIG. 18, an output buffer includes transistors Q221–Q223 which are p type MOSFETs, transistors Q224–Q228 which are n type MOSFETs, inverters G2221–G223, and NAND gates G224 and G225.

Transistor Q221 is connected to high voltage $V_{PP}$ and transistor Q224. Transistor Q224 is connected to ground potential GND. Transistor Q222 is connected to high voltage $V_{PP}$ and transistor Q225. Transistor Q221 has its gate connected to the node between transistors Q222 and Q225. Transistor Q222 has its gate connected to the node between transistors Q221 and Q224. Transistor Q223 is connected to high voltage $V_{PP}$ and transistor Q226. Transistor Q226 is connected to ground potential GND. Transistors Q223 and Q226 have their gates connected to the node between transistors Q222 and Q225. Transistor Q227 is connected to power supply voltage $V_{CC}$ and transistor Q228. Transistor Q228 is connected to ground potential GND. Output buffer activation signal OEM and data signal D are provided to NAND gate G225. The output side of NAND gate G225 is connected to the gate of transistor Q224 and inverter G221. The output side of inverter G221 is connected to the gate of transistor Q225. Output buffer activation signal OEM and data signal D via inverter G222 are applied to NAND gate G224. The output side of NAND gate G224 is connected to inverter G223. The output side of inverter G223 is connected to the gate of transistor Q228. Transistor Q227 has its gate connected to the node between transistors Q223 and Q226.

An operation of the above-structured output buffer will be described hereinafter. The output buffer drives the gate of transistor Q227 at high voltage $V_{PP}$ in order to compensate for the voltage drop due to the threshold voltage of transistor Q222 to set the H level of output signal Dout to power supply voltage $V_{CC}$. Therefore, when data signal D and output buffer activation signal OEM both attain a H level, output signal Dout is provided at a H level. Here, when the output signal $\phi_{E4}$ of fourth detector 51 of FIG. 16 attains a H level, Dout pump 52 is activated to replenish high voltage $V_{PP}$ consumed by output buffer 53. When the DRAM attains a page mode, output signal Dout is continuously provided at the cycle of approximately 25 ns. Therefore, fourth detector 51 requires high speed as in third detector 43. Because fourth detector 51 operates similarly to third detector 43, high speed operation is carried out in response to output buffer activation signal OEM and data signal D. Furthermore, power is not consumed except for during the data output period. Therefore, reduction in power consumption during standby can be realized.

Another example of the internal high voltage circuit FIG. 15 will be described hereinafter with reference to FIG. 19.

Figure 19:
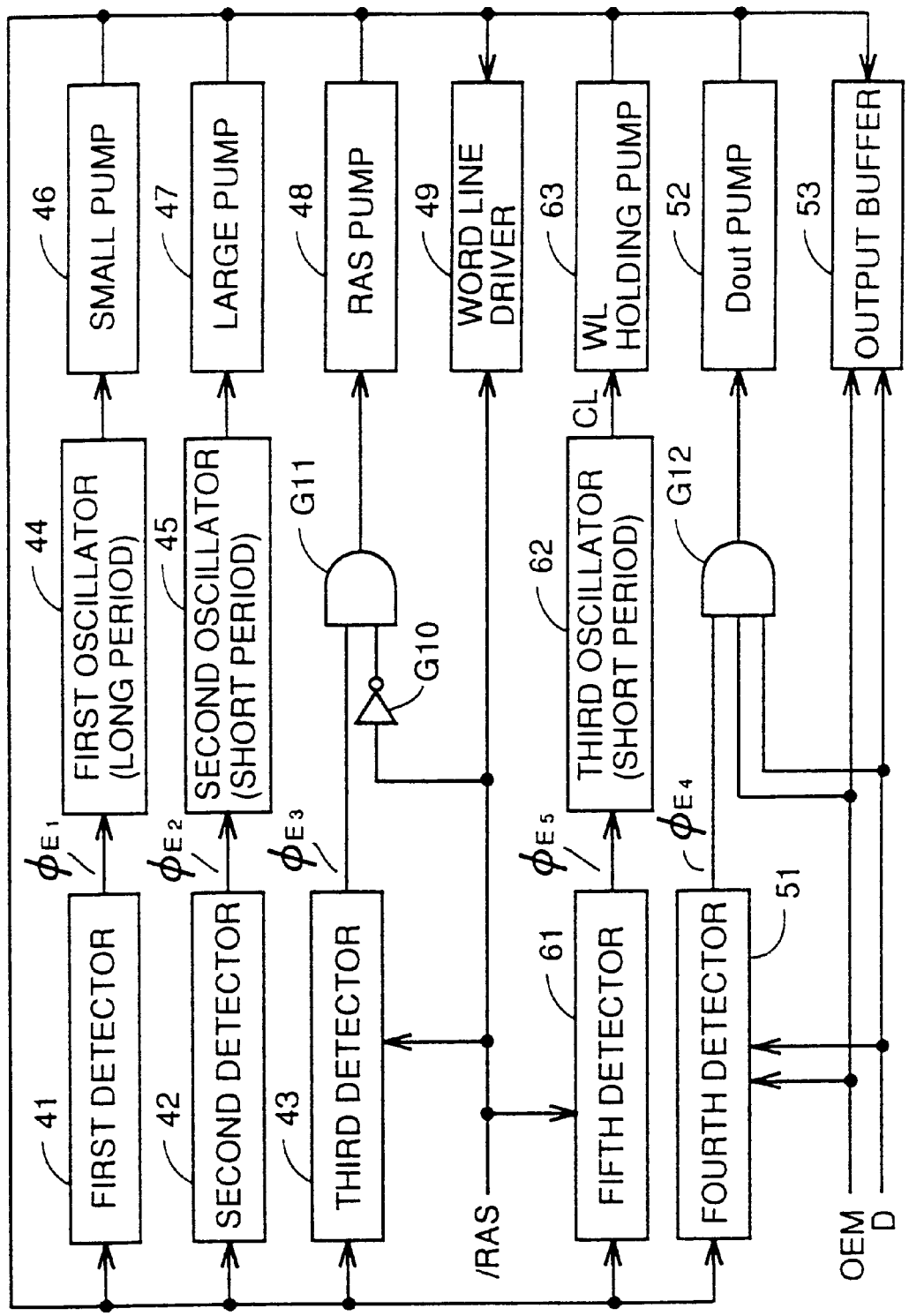
FIG. 19 is a block diagram showing a second example of a structure of the internal high voltage circuit of FIG. 15.

The internal high voltage circuit of FIG. 19 differs from the internal high voltage circuit of FIG. 16 in that a fifth detector 61, a third oscillator 62, and a WL holding pump 63 are added. The remaining components are similar to those of FIG. 16, and the same reference characters are denoted. Therefore, descriptions thereof will not be repeated.

Fifth detector 61 detects the potential of high voltage $v_{pp}$ supplied to word line driver 49. When high voltage $V_{PP}$ is lower than a predetermined value, an output signal $\phi_{E5}$ of a H level is provided to third oscillator 62 in response to row address strobe signal/RAS. Third oscillator 62 oscillates when output signal $\phi_{E5}$ attains a H level, and provides a clock signal CL of a short period to WL holding pump 63. WL holding pump 63 is driven by clock signal CL from third oscillator 62, and supplies high voltage $V_{PP}$ to word line driver 49 when row address strobe signal/RAS attains a L level, i.e. when a word line is selected, in order to prevent, for example, a word line from being short-circuit to another interconnection which will cause reduction in high voltage $V_{PP}$.

Figure 20:
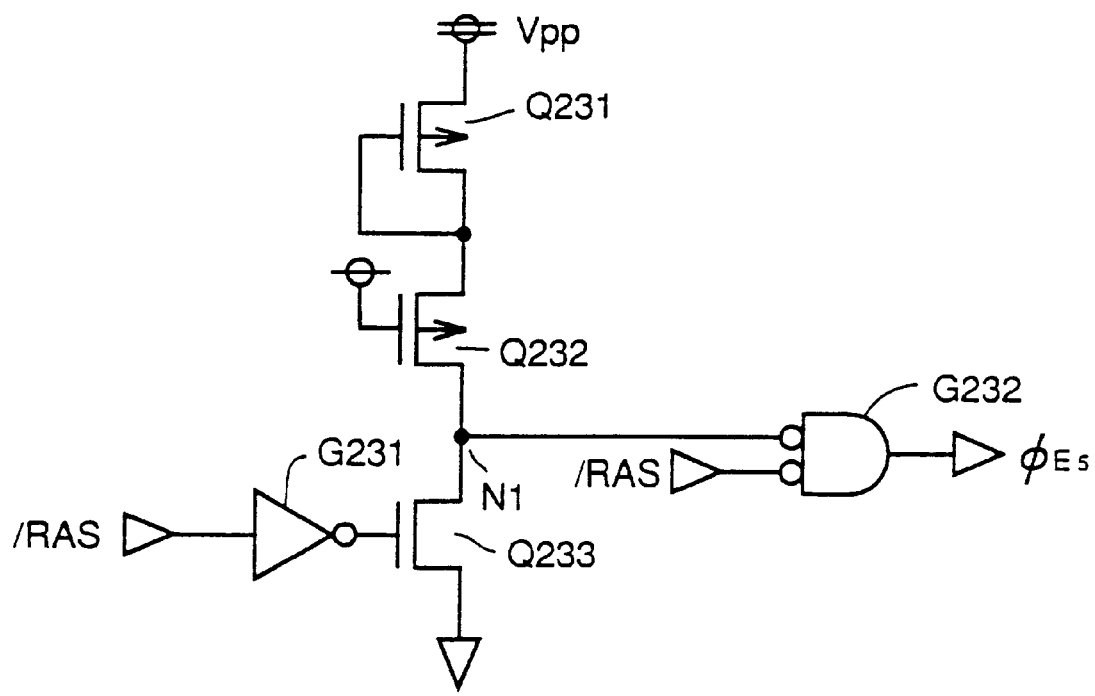
FIG. 20 is a circuit diagram showing a structure of the fifth detector of FIG. 19.

The fifth detector of FIG. 19 will be described hereinafter with reference to FIG. 20 showing a circuit diagram thereof.

Referring to FIG. 20, a fifth detector includes transistors Q231 and Q232 which are p type MOSFETs, a transistor Q233 which is an n type MOSFET, an inverter G231, and an NAND gate G232.

Diode-connected transistor Q231 is connected to high voltage $V_{PP}$ and transistor Q232. Transistor Q232 is connected to transistor Q233. Transistor Q232 has its gate connected to power supply voltage $V_{CC}$. Transistor Q233 is connected to ground potential GND. Row address strobe signal/RAS is applied to the gate of transistor Q233 via inverter G231. NAND gate G232 receives an output signal of node N1 and row address strobe signal/RAS to provide an output signal $\phi_{E5}$.

An operation of the above-structured fifth detector will be described hereinafter. The fifth detector has the channel of transistor Q231 sets to a short channel length, so that the speed of the potential of node N1 pulled down to a L level from a H level when the level of high voltage $V_{PP}$ falls becomes faster during the period of row address strobe signal/RAS attaining a L level. More specifically, the fifth detector can respond speedily when row address strobe signal/RAS attains a L level. Because it is not necessary to increase the current in transistor Q233 to rapidly pull the potential of node N1 down to a L level, power consumption during standby is reduced, to realize reduction of power consumption of the device.

Figure 21:
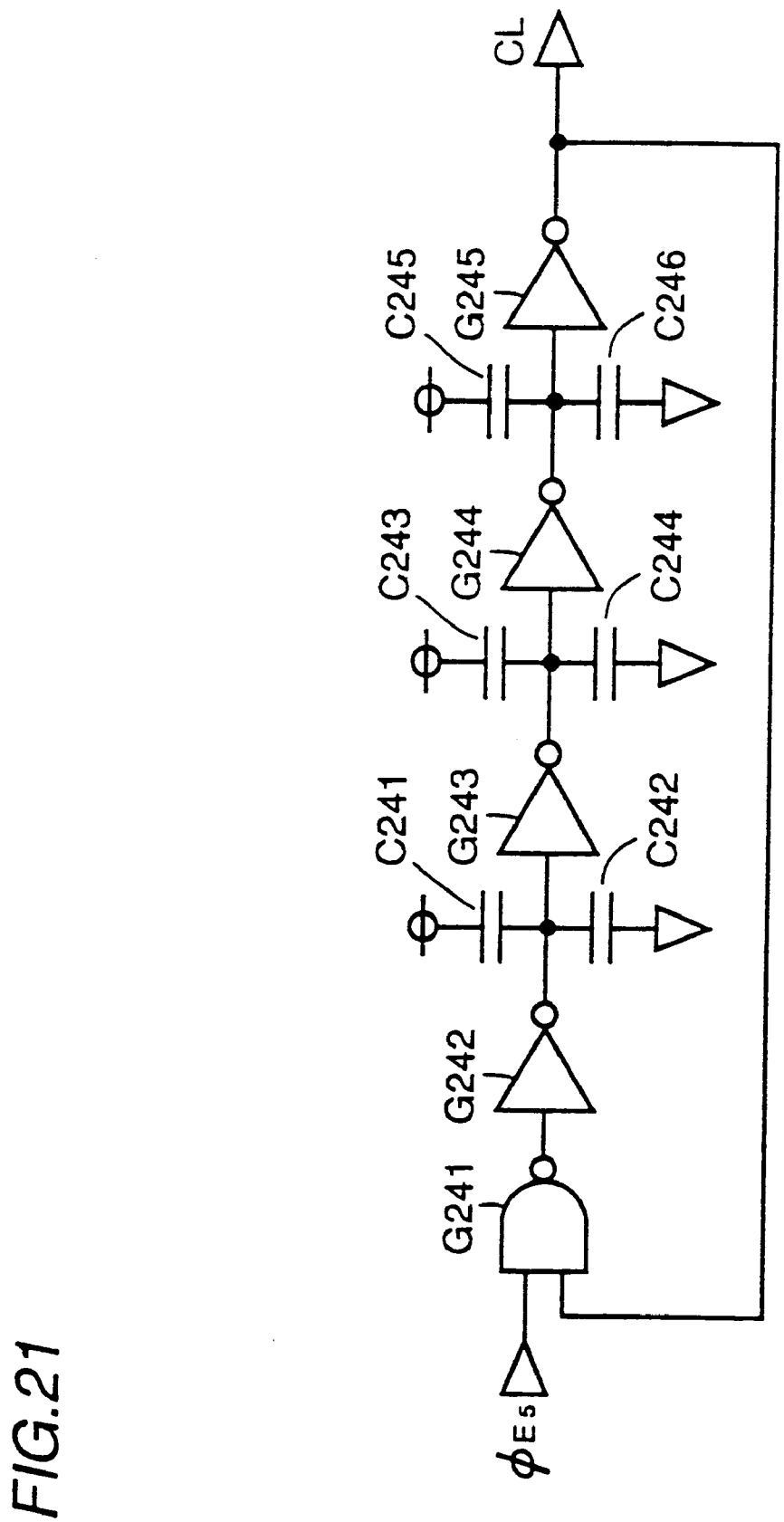
FIG. 21 is a circuit diagram showing a structure of the third oscillator of FIG. 19.

The third oscillator shown in FIG. 19 will be described hereinafter with reference to the circuit diagram of FIG. 21. Referring to FIG. 21, a third oscillator 62 includes an NAND gate G211, inverters G222–G245, and capacitors C241–C246.

NAND gate G241 receives an output signal $\phi_{E5}$ of the fifth detector, and is connected to inverter G242. Inverter G242 is connected to capacitors C241, C242, and inverter G243. Inverter G243 is connected to capacitors C243, C244, and inverter G244. Inverter G244 is connected to capacitors C245, C246, and inverter G245. Capacitors C241, C243 and C245 are connected to power supply voltage $V_{CC}$. Capacitors C242, C244 and C246 are connected to ground potential GND. The output of inverter G245 is provided as a clock signal CL, and is applied to NAND gate G241.

The above-described third oscillator forms the well known ring oscillator, and provides a clock signal CL of a short predetermined period when output signal $\phi_{E5}$ attains a high level.

The WL holding pump of FIG. 19 will be described hereinafter with reference to the circuit diagram of FIG. 22.

Figure 22:
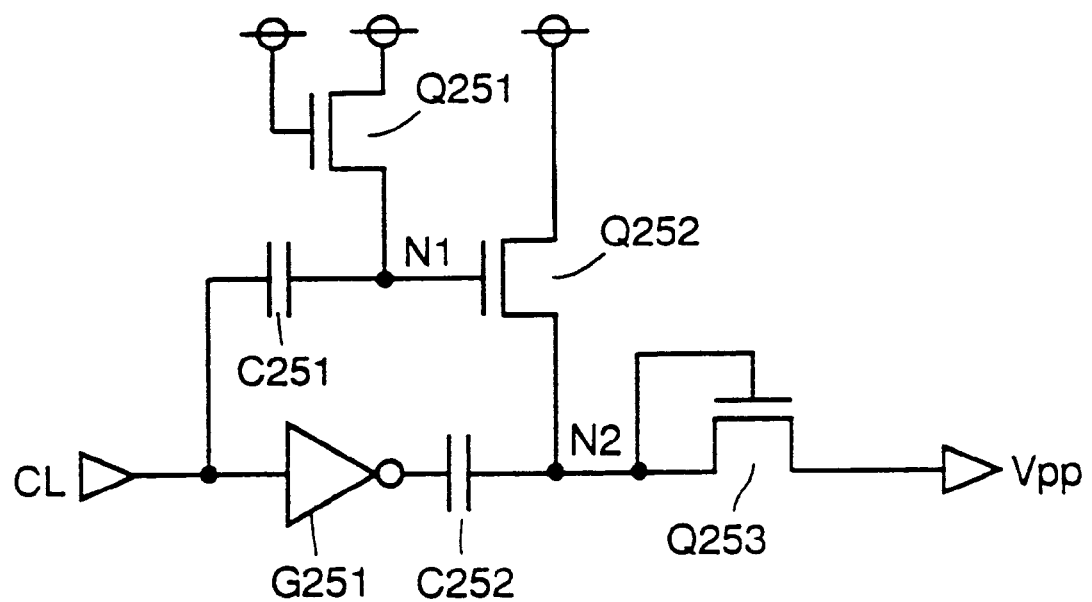
FIG. 22 is a circuit diagram showing a structure of the WL holding pump of FIG. 19.

Referring to FIG. 22, a WL holding pump includes transistors Q251–Q253 which are n type MOSFETs, capacitors C251, C252, and an inverter G251.

Transistor Q251 is connected to power supply voltage $V_{CC}$, capacitor C251, and the gate of transistor Q252. Transistor Q251 has its gate connected to power supply voltage $V_{CC}$. Transistor Q252 is connected to power supply voltage $V_{CC}$, capacitor C252 and diode-connected transistor Q253. Clock signal CL is applied to capacitor C251 and inverter G251. Inverter G251 is connected to capacitor C252.

The above-structured WL holding pump operates as follows. When clock signal CL attains a L level, node N1 is charged to a level of $V_{CC}-V_{TH}$ ($V_{TH}$ is the threshold voltage of transistor Q251). When clock signal CL attains a H level, node N1 is boosted by capacitor C251, whereby the potential of node N1 becomes $2 V_{CC}-V_{TH}$. Therefore, the potential of node N2 is gradually charged to the level of power supply voltage $V_{CC}$. Then when clock signal CL attains a L level, node N2 is boosted by capacitor C252, whereby the potential of node N2 becomes $2 V_{CC}$. Here, transistor Q 253 conducts, so that output signal $V_{pp}$ is boosted to the maximum level of $2 V_{CC}-V_{TH}$ to be output.

A further example of the internal high voltage circuit of FIG. 15 will be described hereinafter with reference to the block diagram of FIG. 23.

Figure 23:
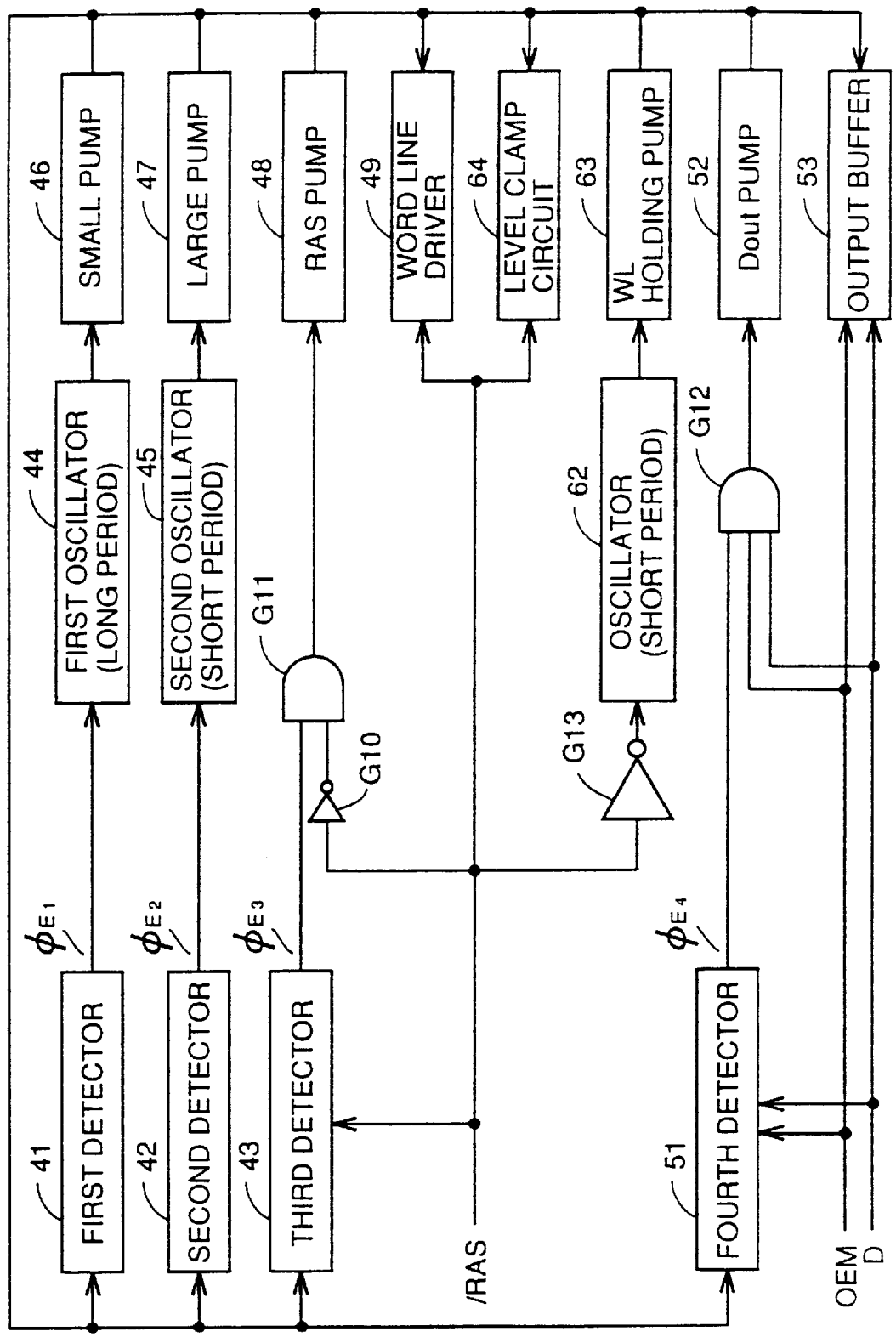
FIG. 23 is a block diagram showing a third example of structure of the internal high voltage circuit of FIG. 15.

The internal high voltage circuit of FIG. 23 differs from the internal high voltage of FIG. 19 in that this detector 61 is omitted, row address strobe signal/RAS is applied to third oscillator 62 via inverter G13, and a level clamp circuits 64 is added. The other components are similar to those of the internal high voltage circuit of FIG. 19, and the same reference characters are denoted thereto. Therefore, the description thereof will not be repeated.

Figure 24:
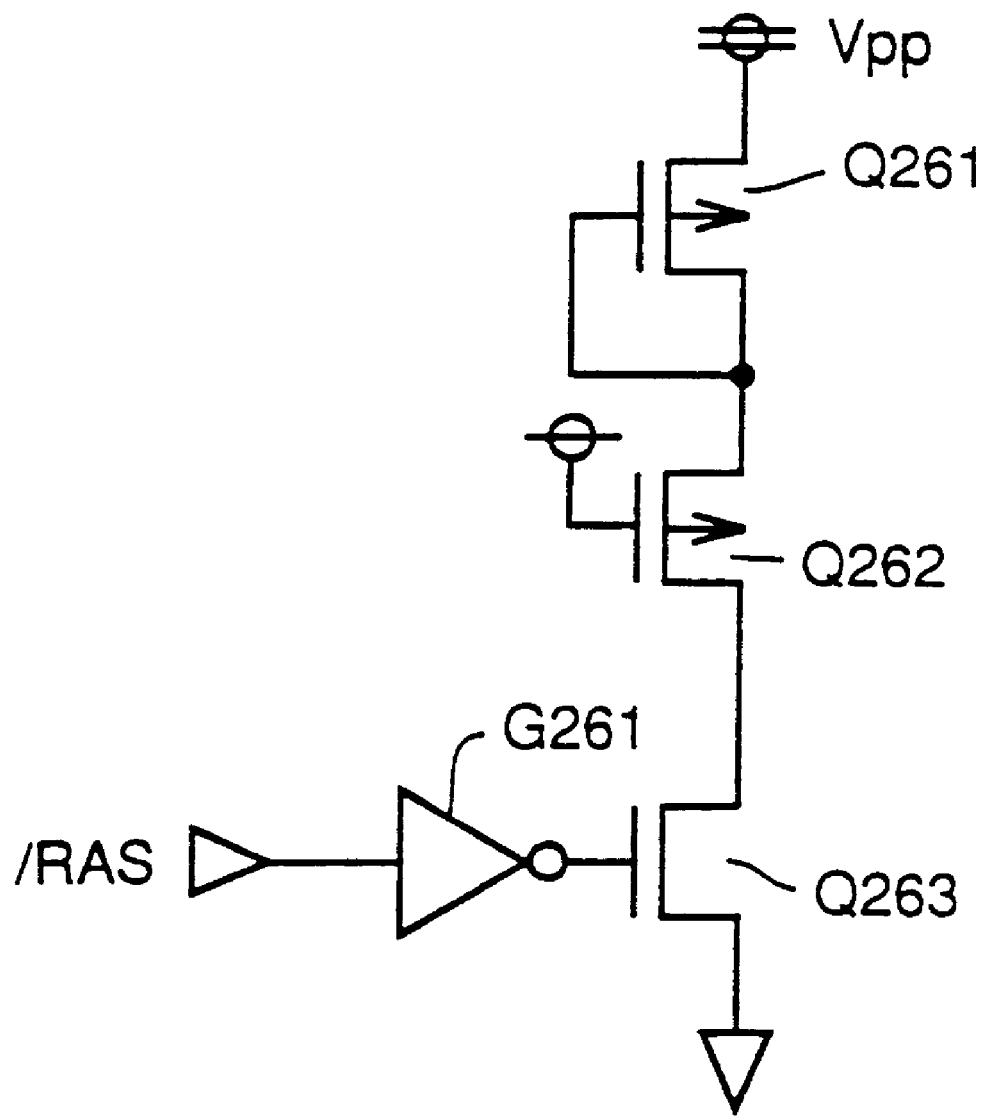
FIG. 24 is a circuit diagram showing a structure of the level clamp circuit of FIG. 23.
Figure 25:
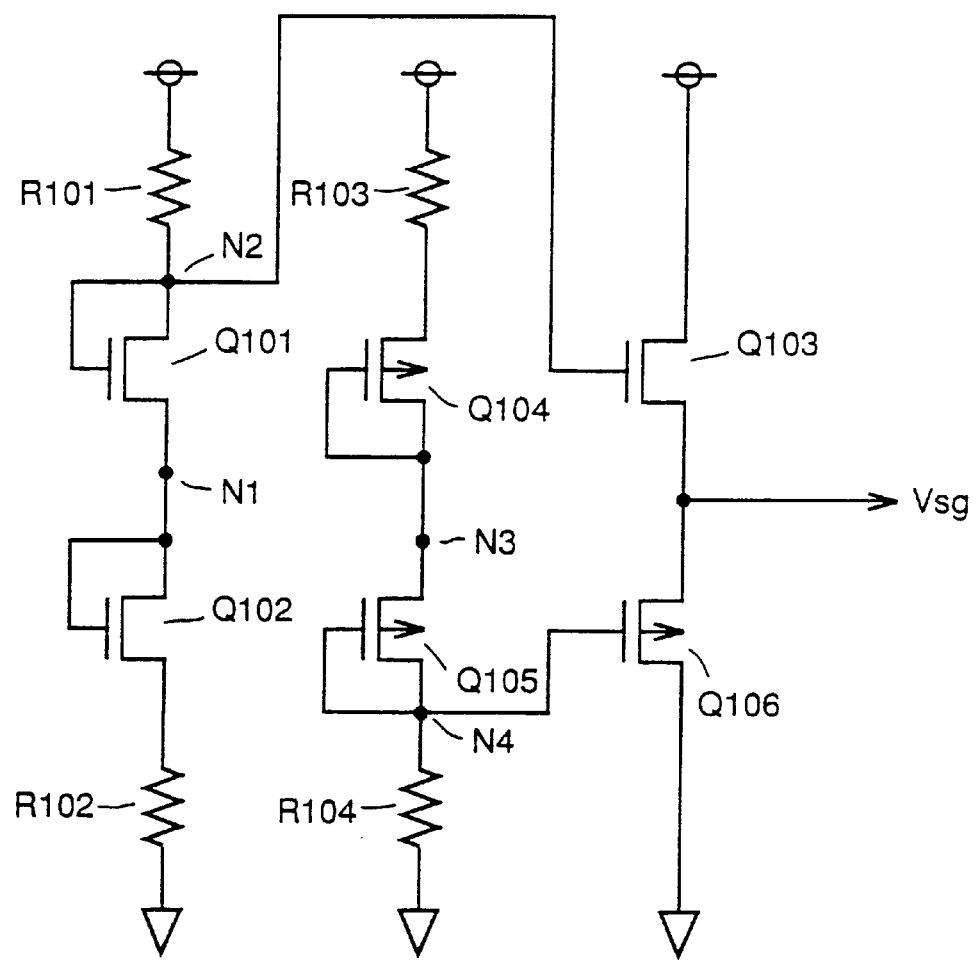
FIG. 25 is a circuit diagram showing a structure of a conventional intermediate potential generation circuit.
Figure 26:
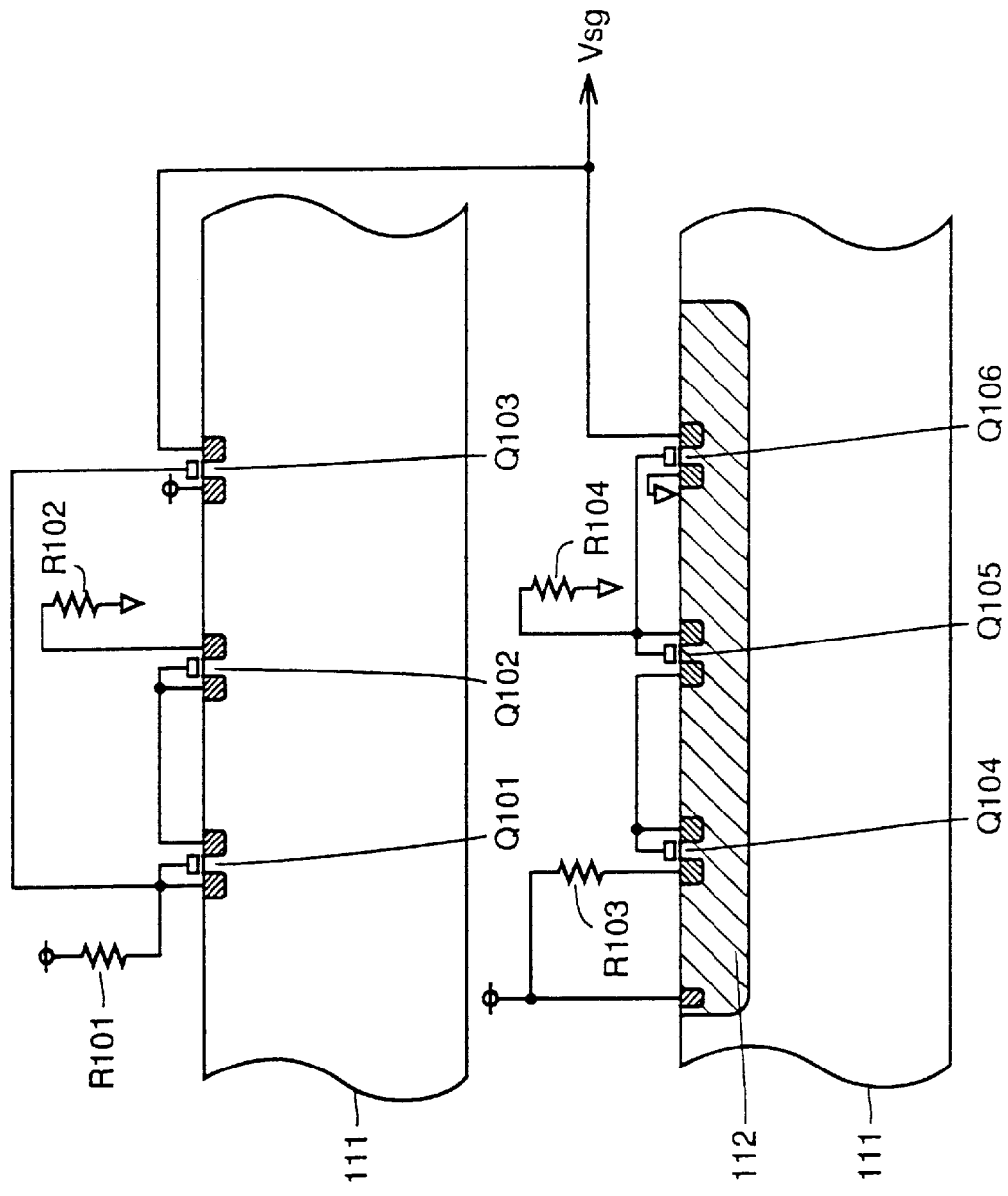
FIG. 26 schematically shows a structure of a conventional intermediate potential generation circuit.
Figure 27:
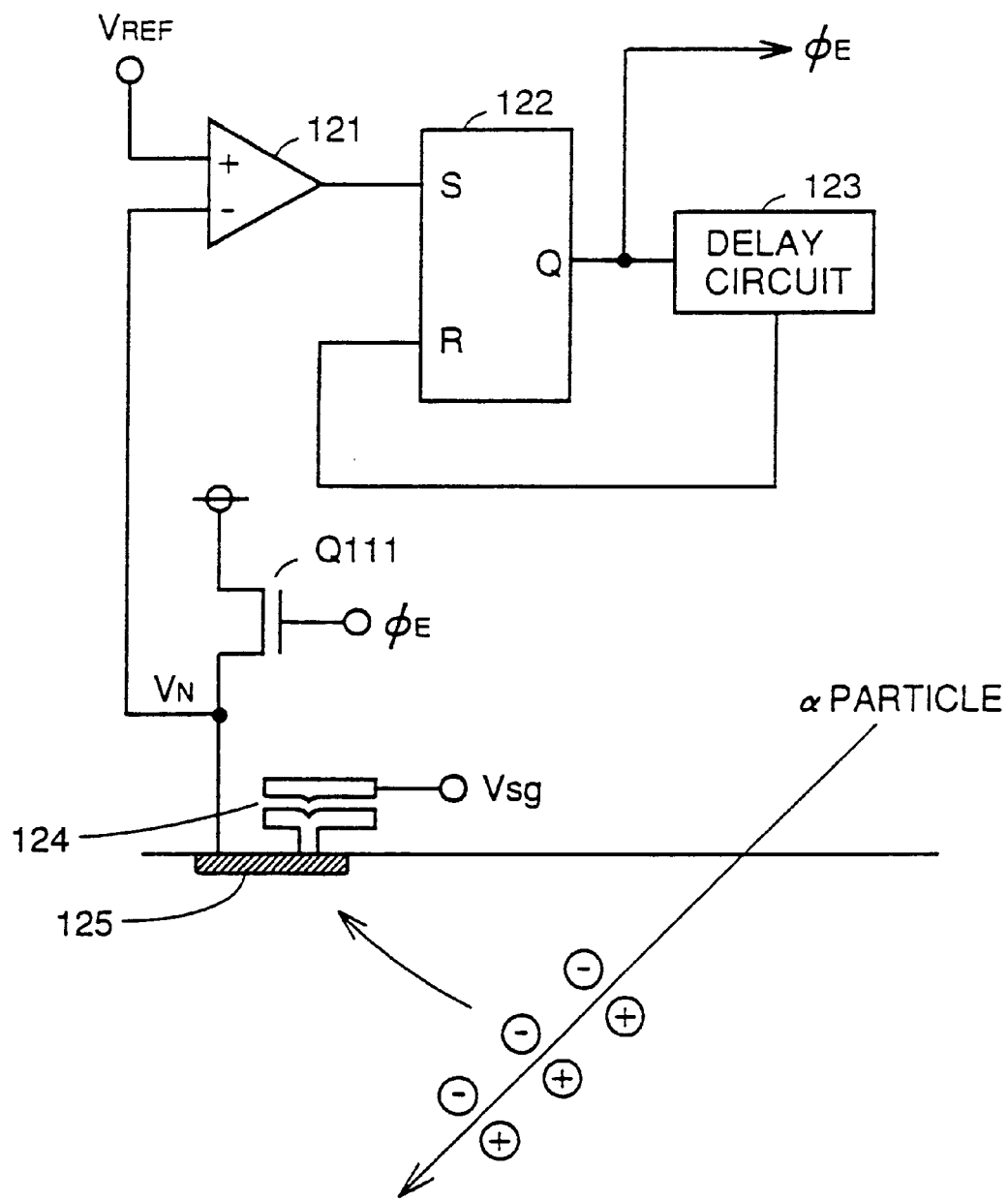
FIG. 27 shows a structure of a conventional self refresh timer circuit.
Figure 29:
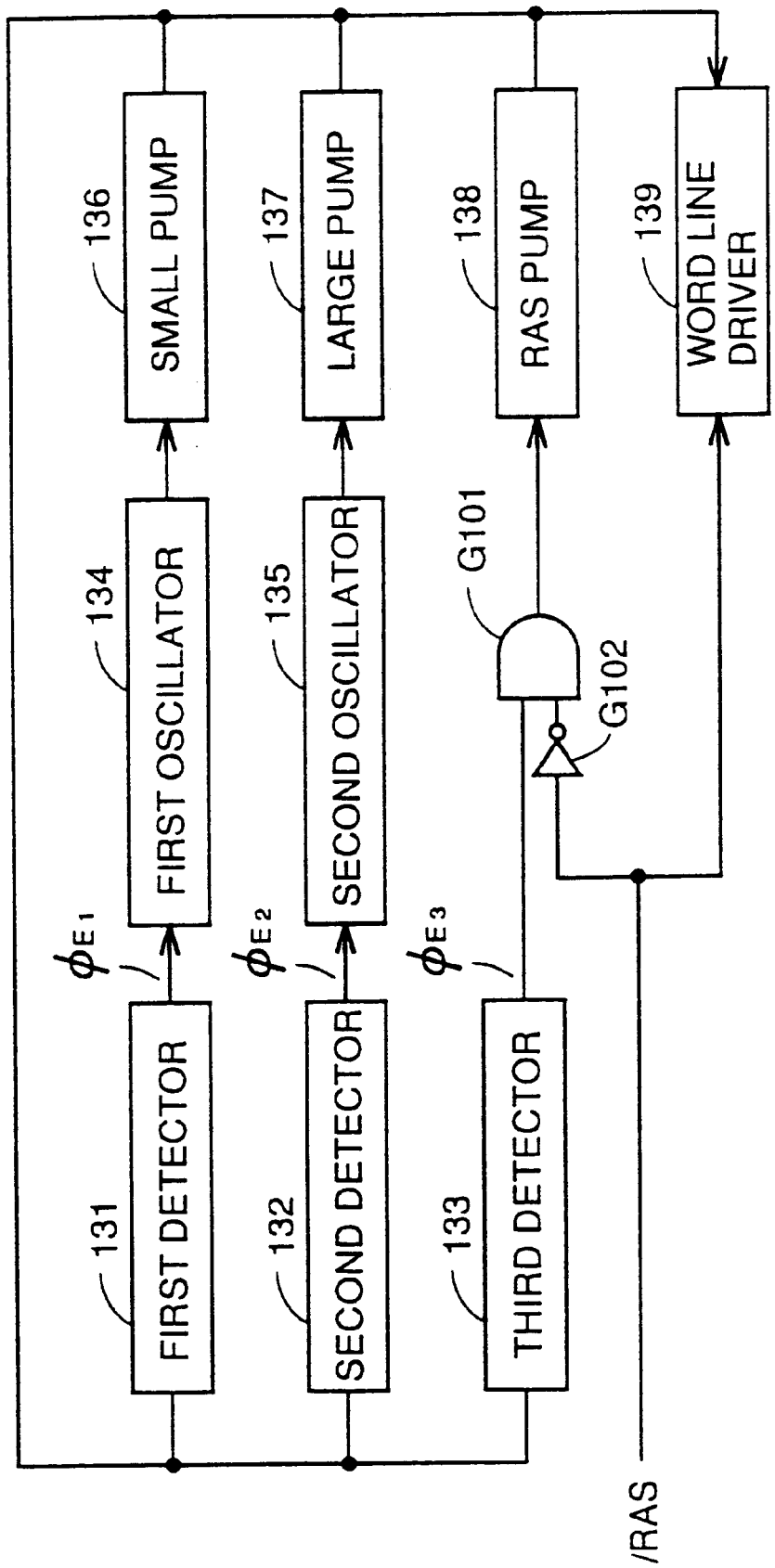
FIG. 29 is a block diagram showing a structure of a conventional internal high voltage circuit.
Figure 30:
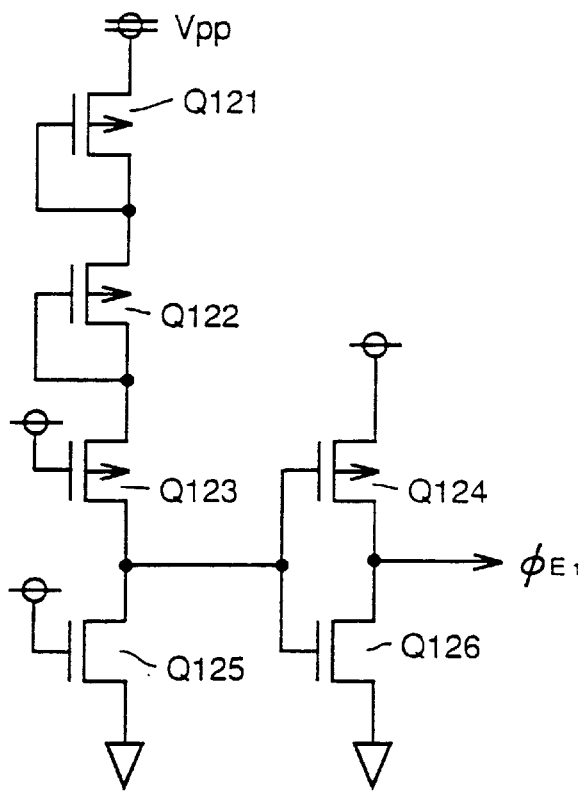
FIGS. 30 and 31 are circuit diagrams showing the structure of first and second detectors, respectively, of FIG. 29.
Figure 31:
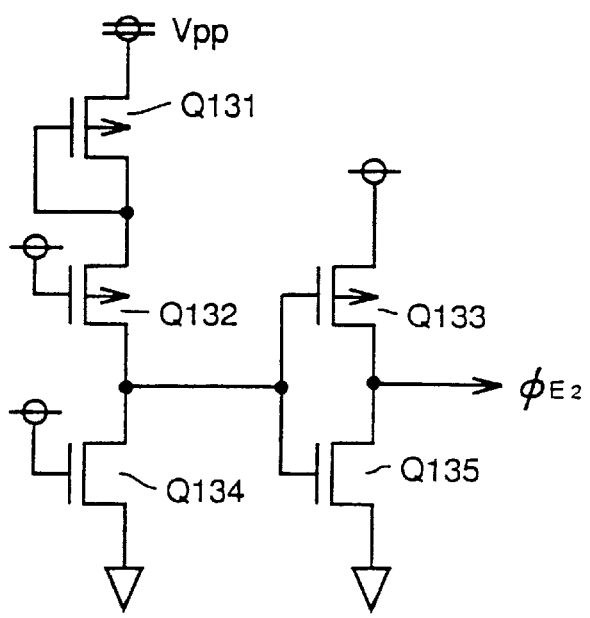
Figure 32:
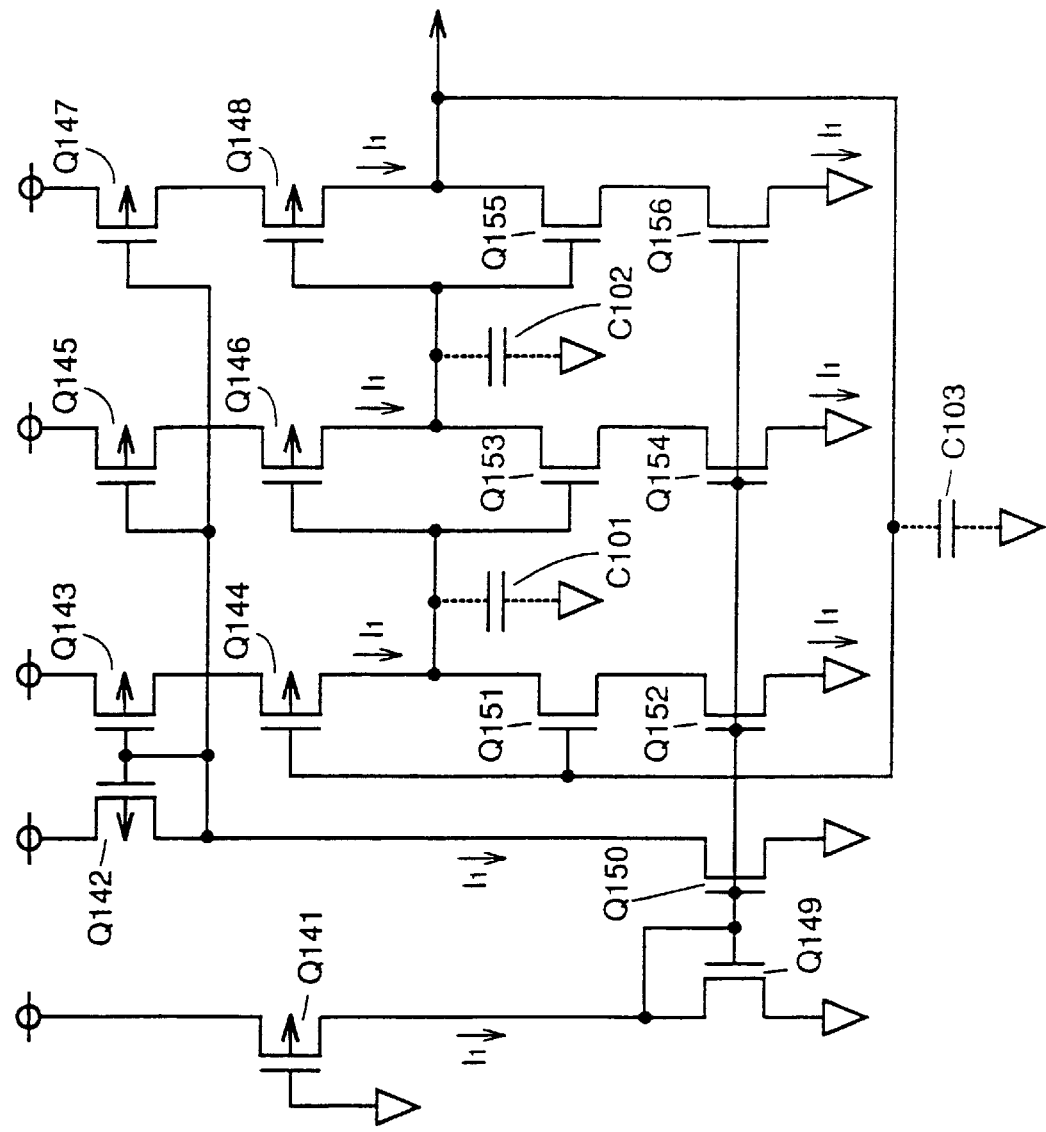
FIG. 32 is a circuit diagram showing a structure of the first oscillator of FIG. 29.

FIG. 24 is a circuit diagram showing a structure of the level clamp circuit of FIG. 23.

Referring to FIG. 24, a level clamp circuit includes transistors Q261, Q262 which are p type MOSFETs, a transistor Q6263 which is an n type MOSFET, and an inverter G261.

Diode-connected transistor Q261 is connected to high voltage $V_{PP}$ and transistor Q262. Transistor 262 is connected to transistor Q263. Transistor Q263 is connected to ground potential GND. Transistor Q262 has its gate connected to power supply voltage $V_{CC}$. Row address strobe signal/RAS is applied to the gate of transistor Q263 via inverter G261.

In the internal high voltage circuit of FIG. 23, the fall of row address strobe signal/RAS to a L level causes the output of inverter G13 to attain a H level, whereby third oscillator 62 operates. WL holding pump 63 operates in response to a clock signal from third oscillator 62. Because WL holding pump 63 is always operated when address strobe signal/RAS attains a L level, the level of high voltage $V_{PP}$ will be increased if the leakage of the word line is low. The level clamp circuit of FIG. 24 is provided to prevent this. More specifically, when row address strobe signal/RAS attains a L level and high voltage $V_{PP}$ exceeds $V_{CC}+2V_{TH}$ ($V_{TH}$ is the threshold voltage of transistors Q261 and Q262), transistors Q261, Q262 and Q263 conduct to clamp the level of high voltage $V_{PP}$ to $V_{CC}+2V_{TH}$.

Because third oscillator 62 in the internal high voltage circuit of FIG. 23 operates speedily in response to address strobe signal/RAS, WL holding pump 63 also operates speedily, whereby the level of high voltage $V_{PP}$ supplied to word line driver 49 is maintained at a constant level. Therefore, the power consumption during standby will not be increased. Thus, reduction in power consumption of the device can be realized.

The present invention is not limited to the DRAM described in the above embodiments, and the present invention may be applied to each circuit having similar function in other semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a self refresh timer circuit, wherein said self refresh timer circuit comprises
    a capacitor for storing charge,
    charging means for charging said capacitor for a predetermined time period when an output of said capacitor becomes lower than a first potential,
    a first current source connected to said capacitor, and
    a second current source connected to said capacitor, amount of current provided by said first current source having a stronger dependence on temperature than said second current source, wherein
    said first current source comprises
        a first transistor of a predetermined channel width, causing leakage of charge of said capacitor to said first potential, and
        voltage-dividing means for voltage-dividing a predetermined second potential for providing an output of a predetermined third potential to a gate of said first transistor, and
    said voltage dividing means comprises
        a second transistor having one end to which said second potential is supplied, and a gate receiving power supply voltage, and
        a third transistor connected between said second transistor and ground potential, and having a gate receiving said power supply voltage, wherein
        the output of said predetermined third potential is supplied from a node connecting said second and third transistors.

2. A semiconductor device including a self refresh timer circuit, wherein said self refresh timer circuit comprises
    a capacitor for storing charge,
    charging means for charging said capacitor for a predetermined time period when an output of said capacitor becomes lower than a first potential,
    a first current source connected to said capacitor, and a second current source connected to said capacitor, amount of current provided by said first current source having a stronger dependence on temperature than said second current source, wherein said first current source comprises
- a first transistor of a predetermined channel width, causing leakage of charge of said capacitor to said first potential, and
- voltage-dividing means for voltage-dividing a predetermined second potential for providing an output of a predetermined third potential to a gate of said first transistor, and said charging means comprises
- a first inverter connected to one end of said capacitor,
- a S-R flip-flop for receiving an output of said first inverter at its set terminal,
- a delay circuit for delaying an output signal of said S-R flip-flop for providing a delayed output signal to a reset terminal of said S-R flips-flop,
- a second inverter for receiving said output signal of said S-R flip-flop, and
- a second transistor connected between power supply voltage and said capacitor, and having a gate receiving an output of said second inventor.

3. A semiconductor device comprising:
a self refresh timer circuit including
(a) a capacitor,
(b) a transistor coupled between an electrode of said capacitor and a power supply, and rendered conductive in response to an output signal generated from said self refresh timer circuit,
(c) a first current source coupled between the electrode of said capacitor and ground,
(d) a second current source coupled between the electrode of said capacitor and ground in parallel to said first current source, the current flowing through said first current source having weaker dependence on temperature than the current flowing through said second current source, and
(e) an output circuit outputting said output signal upon attaining a prescribed level for a predetermined period in response to a potential level of the electrode of said capacitor; and
a control circuit determining timing of a self refresh operation in response to the output signal generated from said self refresh timer circuit.

4. The semiconductor device according to claim 3, wherein said output circuit includes
- a flipflop set in response to the potential level of the electrode of said capacitor, and
- a delay circuit coupled to an output of said flipflop and providing a delayed output signal to reset said flipflop.

5. The semiconductor device according to claim 4, wherein said output circuit further includes
an inverter having an input connected to the electrode of said capacitor and providing an inverted signal to set said flipflop.

6. The semiconductor device according to claim 3, wherein
said first current source includes a first n type MOSFET coupled between the electrode of said capacitor and ground, and a second n type MOSFET having a gate connected to a gate of said first n type MOSFET and being coupled between power supply and ground, and
said second current source includes (a) a third n type MOSFET coupled between the electrode of said capacitor and ground, (b) a voltage divider coupled between a first node and ground, and providing a division potential between a potential of the first node and a ground potential to a gate of said third n type MOSFET, (c) a fourth MOSFET coupled between power supply and the first node, (d) a fifth MOSFET having a gate connected to a gate of said fourth MOSFET and coupled between power supply and a second node, and (e) a sixth n type MOSFET coupled between the second node and ground.

7. The semiconductor device according to claim 6, wherein
the gates of said first and second n type MOSFETs are coupled to a drain of said second n type MOSFET,
said fourth and fifth MOSFETs are n type MOSFETS,
the gates of said fourth and fifth MOSFETS are coupled to a drain of said fifth MOSFET, and
a gate of said sixth n type MOSFET is coupled to a drain of said sixth n type MOSFET.

8. The semiconductor device according to claim 7, wherein
said first current source further includes a first p type MOSFET coupled between power supply and the drain of said second n type MOSFET, and
said second current source further includes a second p type MOSFET coupled between power supply and the drain of said fifth MOSFET.

9. The semiconductor device according to claim 6, wherein said voltage divider includes
a first resistor formed of an n type MOSFET having a gate coupled to power supply, and coupled between the first node and the gate of said third n type MOSFET, and
a second resistor formed of an n type MOSFET having a gate coupled to power supply, and coupled between the gate of said third n type MOSFET and ground.

* * * * *